(12) United States Patent
Hori et al.

(10) Patent No.: US 7,678,711 B2
(45) Date of Patent: Mar. 16, 2010

(54) SEMICONDUCTOR DEVICE, AND METHOD AND APPARATUS FOR MANUFACTURING THE SAME

(75) Inventors: Mitsuaki Hori, Kawasaki (JP);
Hiroyuki Ohta, Kawasaki (JP);
Katsuaki Ookoshi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 254 days.

(21) Appl. No.: 11/147,212

(22) Filed: Jun. 8, 2005

(65) Prior Publication Data
US 2005/0236679 A1 Oct. 27, 2005

Related U.S. Application Data

(63) Continuation-in-part of application No. 10/851,212, filed on May 24, 2004, now abandoned.

(30) Foreign Application Priority Data

Jan. 6, 2004 (JP) .............................. 2004-001011
Sep. 24, 2004 (JP) .............................. 2004-277321

(51) Int. Cl.
*H01L 21/31* (2006.01)
(52) U.S. Cl. ...................... 438/785; 438/287; 438/786; 257/E21.487

(58) Field of Classification Search ................. 438/785, 438/786, 287
See application file for complete search history.

(56) References Cited

U.S. PATENT DOCUMENTS

| 5,976,991 | A | 11/1999 | Laxman et al. |
| 6,486,083 | B1 | 11/2002 | Mizuno et al. |
| 6,716,772 | B2 | 4/2004 | Mizuno et al. |
| 6,890,811 | B2 * | 5/2005 | Hou et al. .................... 438/216 |
| 7,022,625 | B2 * | 4/2006 | Ang et al. .................... 438/787 |
| 7,365,403 | B1 * | 4/2008 | Ramkumar .................. 257/410 |
| 2001/0000476 | A1 * | 4/2001 | Xia et al. ................ 427/255.27 |
| 2002/0197890 | A1 | 12/2002 | Mizuno et al. |

FOREIGN PATENT DOCUMENTS

EP 0 844 647 A2 5/1998

(Continued)

OTHER PUBLICATIONS

Japanese Patent Office, Patent Abstracts of Japan, Publication No. 07050347 A, dated Feb. 21, 1995. Cited in the specification.

(Continued)

*Primary Examiner*—Alexander G Ghyka
(74) *Attorney, Agent, or Firm*—Westerman, Hattori, Daniels & Adrian, LLP

(57) ABSTRACT

A $SiO_2$ film is formed on a semiconductor substrate. Then, a SiN film is formed on the $SiO_2$ film. In this event bis(tertiary butyl amino) silane and $NH_3$ are used as a material gas, and the film forming temperature is set to 600° C. or lower.

6 Claims, 21 Drawing Sheets

FOREIGN PATENT DOCUMENTS

| | | | |
|---|---|---|---|
| JP | 9-213942 | A | 8/1997 |
| JP | 10-189587 | A | 7/1998 |
| JP | 2000-77403 | A | 3/2000 |
| JP | 2001-156067 | A | 6/2001 |
| JP | 2001-230248 | A | 8/2001 |
| JP | 2002-0523897 | A | 7/2002 |
| WO | WO 00/11708 | * | 3/2000 |
| WO | WO 00/11708 | A1 | 3/2000 |

OTHER PUBLICATIONS

Japanese Patent Office, Patent Abstracts of Japan, Publication No. 11172439 A, dated Jun. 29, 1999.

Japanese Patent Office, Patent Abstracts of Japan, Publication No. 2000077403 A, dated Mar. 14, 2000. Cited in the specification.

Japanese Office Action dated Dec. 18, 2007, issued in corresponding Japanese Application No. 2004-277321, Partial.

Prior Art Information List.

* cited by examiner

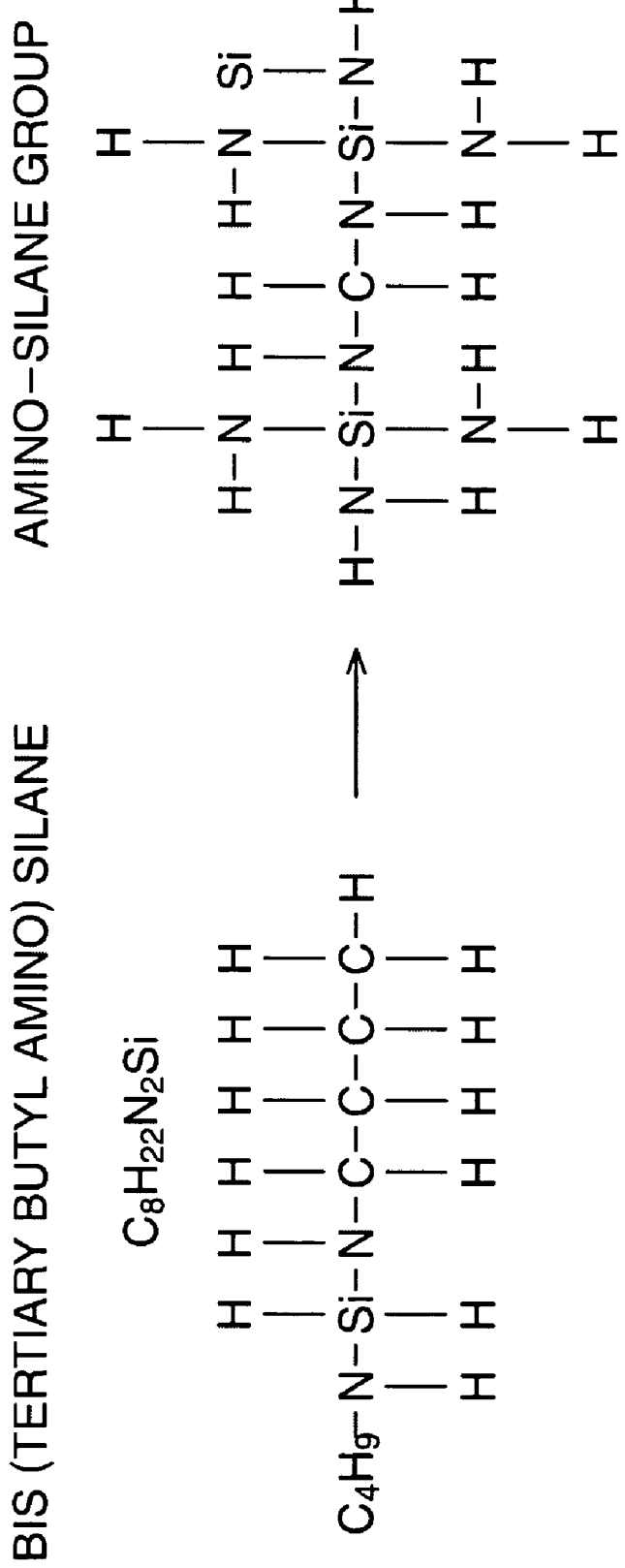

DISTRIBUTION FROM VAPOR PHASE TO SOLID STATE

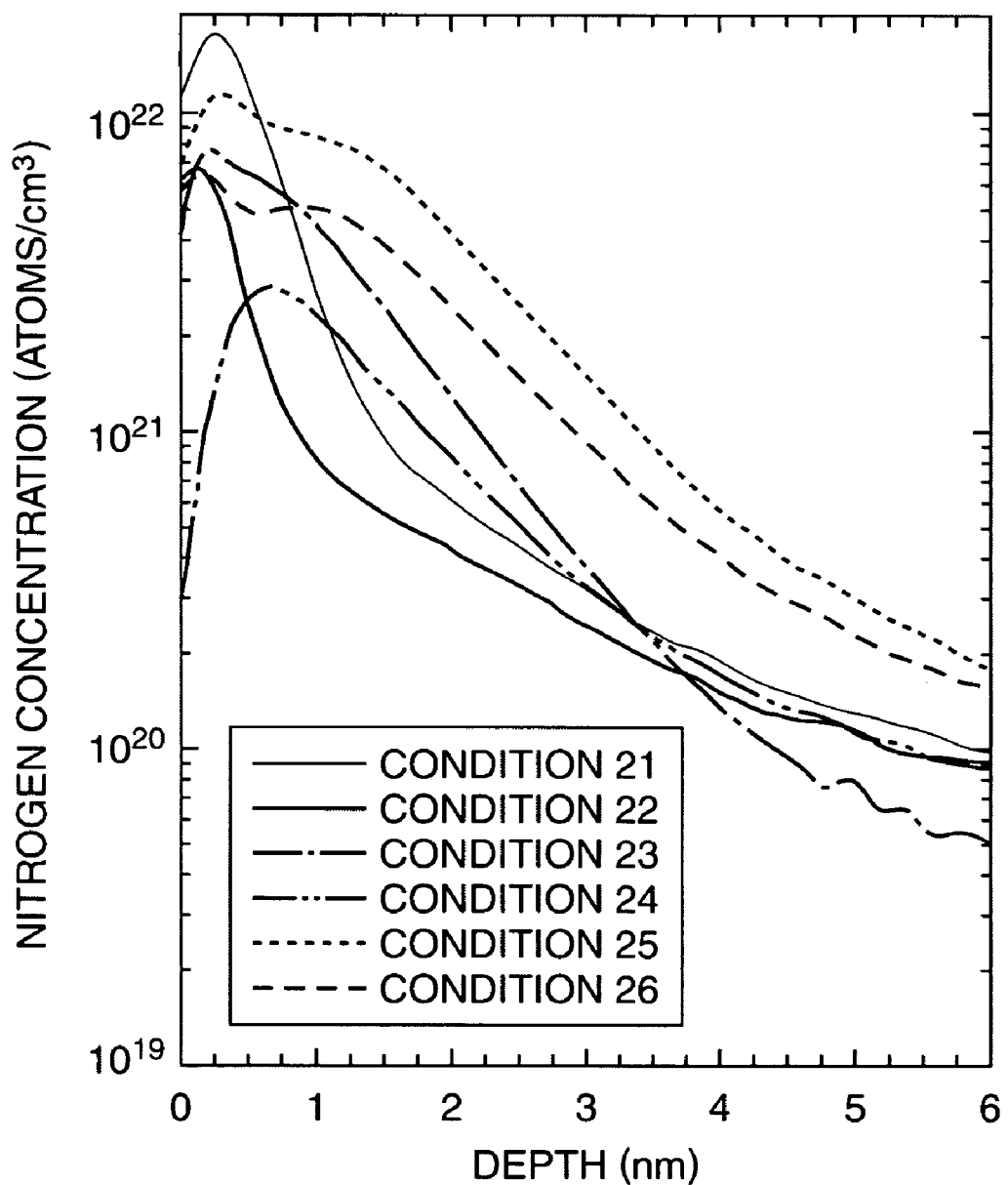

SEMICONDUCTOR DEVICE, AND METHOD AND APPARATUS FOR MANUFACTURING THE SAME

CROSS-REFERENCE TO RELATED APPLICATIONS

This is a continuation-in-part application of application Ser. No. 10/851,212, filed on May 24, 2004 now abandoned.

This application is based upon and claims the benefit of priority from the prior Japanese Patent Application Nos. 2004-001011, filed on Jan. 6, 2004 and 2004-277321, filed on Sep. 24, 2004 the entire contents of which are incorporated herein by reference.

BACKGROUND OF THE INVENTION

1. Field of the Invention

The present invention relates to a semiconductor device including a gate insulation film in a layered structure, and a method and an apparatus for manufacturing the same.

2. Description of the Related Art

In recent years, thinning of a gate insulation film has been on progress, with which a reduction in leak current has been required. Hence, trials are made to layer on a silicon oxide film ($SiO_2$ film) a silicon nitride film (SiN film), which has a dielectric constant higher than that of the $SiO_2$ film, and to nitride the surface of a $SiO_2$ film by a remote plasma method to thereby form a SiON film thereon.

In a method for layering the SiN film, dichlorosilane (DCS) or trichlorosilane (TCS) and $NH_3$ are used as a material gas. However, when using this material gas, the SiN film is not uniformly formed on the $SiO_2$ film. Therefore, the surface of the $SiO_2$ film is thermally nitrided at about 700° C. to 850° C. before the formation of the SiN film to thereby form a SiON film thereon. However, when this method is employed to try to obtain a gate insulation film with a thickness of about 1.2 nm, a large amount of nitrogen reaches not only the surface of the $SiO_2$ film but also a silicon substrate during nitridation, so that a threshold value Vth of a field effect transistor varies in the negative direction. Further, there also is a problem that the mobility of holes in a channel decreases.

On the other hand, in the method for nitridation by the remote plasma method, when control is conducted to decrease the nitrogen concentration in the vicinity of the surface of the silicon substrate to avoid the above-described disadvantage, the nitridation of the $SiO_2$ film is not enough, resulting in insufficient effect to reduce the leak current. Besides, when trying to sufficiently reduce the leak current, the problem of the variation in threshold value and the decrease in mobility is not solved as in the above-described layering.

In addition, as a method for forming a nitride film, a method using bis(t-butylamino) silane is also disclosed (Patent Documents 3 and 4).

Prior arts are disclosed in Patent Document 1 (Japanese Patent Application Laid-open No. Hei 7-50347), Patent Document 2 (Translated National Publication of Patent Application No. 2002-523897), the Patent Document 3 (Japanese Patent No. 2962417), and the Patent Document 4 (Japanese Patent No. 3055123).

SUMMARY OF THE INVENTION

It is an object of the present invention to provide a semiconductor device capable of decreasing leak current with suppressing a variation in threshold value and a decrease in mobility, and a method and an apparatus for manufacturing the same.

As a result of earnest studies to solve the above problems, the present inventor has devised various aspects of the invention described below.

In a method for manufacturing a semiconductor device according to the present invention, a gate insulation film is formed over a semiconductor substrate, and thereafter a conductive film is formed over the gate insulation film. When forming the gate insulation film, a first insulation film is formed, and thereafter over the first insulation film a second insulation film composed of a nitride or an oxynitride is formed using a material gas containing carbon.

According to this method, a semiconductor device is obtained which comprises a semiconductor substrate, a gate insulation film formed over the semiconductor substrate, and a gate electrode formed over the gate insulation film, wherein the gate insulation film comprises a first insulation film, and a second insulation film formed over the first insulation film and composed of a nitride or an oxynitride containing carbon, for example.

Further, an apparatus for manufacturing a semiconductor device according to the present invention is suitable for implementing the above-described manufacturing method. The apparatus comprises: a carrier carrying a semiconductor substrate in an atmosphere isolated from atmospheric air; a first insulation film former forming a first insulation film over the semiconductor substrate; a second insulation film former forming a second insulation film composed of a nitride or an oxynitride using a material gas containing carbon over the first insulation film; and a heater performing post-annealing on the first and second insulation films. Further, the first insulation film former, the second insulation film former, and the heater are connected to the carrier unit.

BRIEF DESCRIPTION OF THE DRAWINGS

FIG. 2 is an illustration showing the change of the structural formula of BTBAS;

FIG. 11 is a graph showing the nitrogen profiles of gate insulation films fabricated by various methods;

DETAILED DESCRIPTION OF THE PREFERRED EMBODIMENTS

Figure 1A:
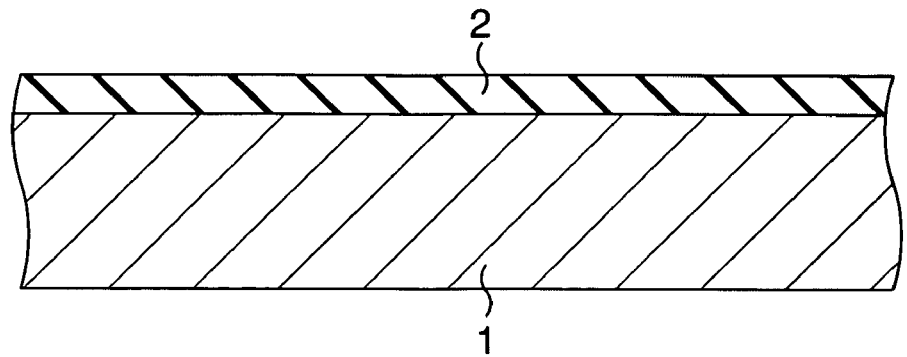
FIGS. 1A to 1C are cross-sectional views showing, in the order of steps, a method for manufacturing a semiconductor device according to an embodiment of the present invention.
Figure 1B:
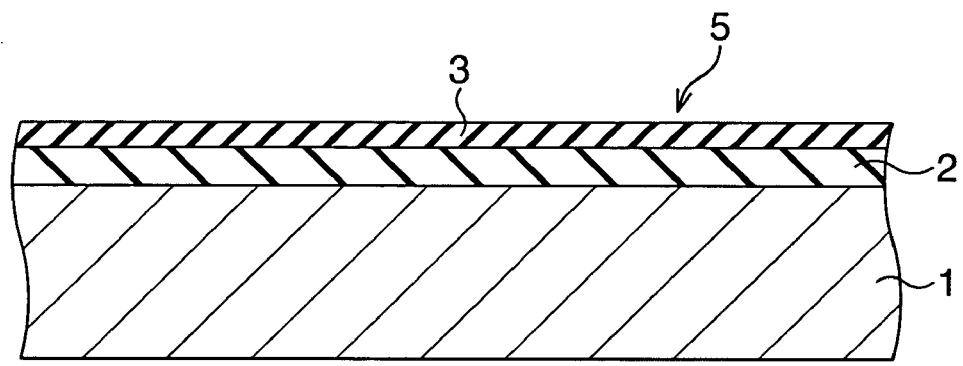
Figure 1C:
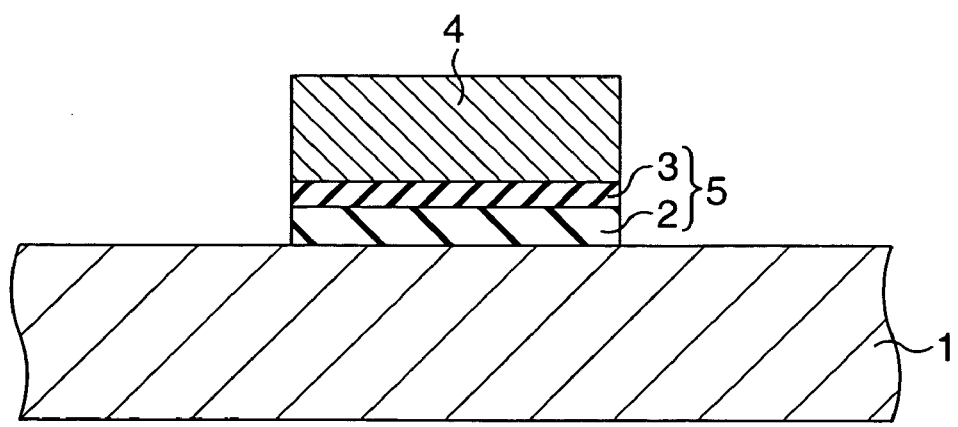

Hereinafter, embodiments of the present invention will be concretely descried with reference to the accompanying the drawings. Note that, for convenience, a structure of a semiconductor device will be described here in conjunction with a method for manufacturing the same. FIGS. 1A to 1C are cross-sectional views showing, in the order of steps, a method for manufacturing a semiconductor device according to an embodiment of the present invention.

In this embodiment, as shown in FIG. 1A, a silicon oxide film ($SiO_2$ film) 2 is first formed as a first insulation film on a surface of a semiconductor substrate 1 such as a silicon substrate, for example, by thermal oxidation. Then, a SiN film 3 is formed as a second insulation film on the $SiO_2$ film 2 by a CVD method. In this event, Bis (Tertiary Butyl Amino) Silane, which is contains carbon, and $NH_3$ are used as a material gas. Hereinafter, Bis (Tertiary Butyl Amino) Silane is referred to as BTBAS. Further, the film forming temperature is, for example, 600° C. or lower. Thus, a gate insulation film 5 is formed which is composed of the $SiO_2$ film 2 and the SiN film 3. Note that, in addition to BTBAS, HMDS (hexamethyldisilazane), TSA (trisilylamine), TMS (trimethylsilane) may be used as the material gas containing carbon. The thickness (physical film thickness) of the gate insulation film 5 is, for example, about 1.2 nm. Subsequently, a conductive film such as a polysilicon film is formed on the SiN film 3 and patterned to form a gate electrode 4 as shown in FIG. 1C. Thereafter, source/drain diffusion layers, interlayer insulation films, wirings, and so on are formed to complete a semiconductor device. It should be noted that the thickness of the $SiO_2$ film 2 is, for example, 0.4 nm to 10 nm, and the thickness of the SiN film 3 is, for example, 0.1 nm to 3.0 nm.

Figure 3A:
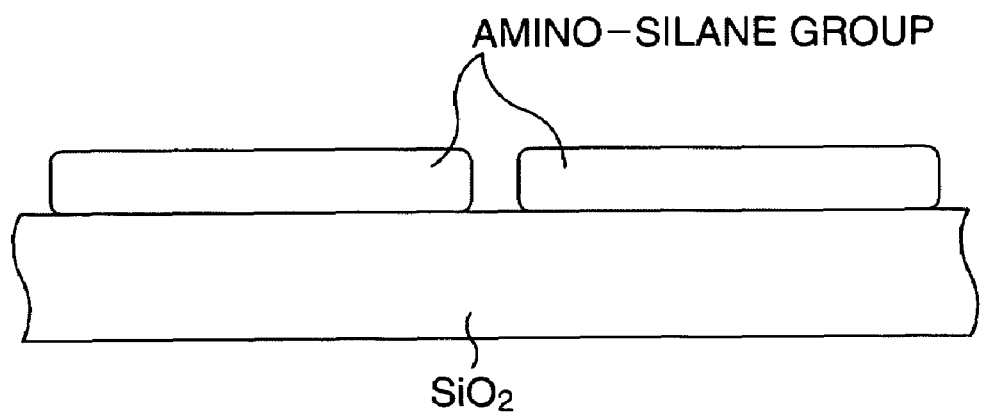
FIGS. 3A and 3B are views showing the appearance of growth of a silicon nitride film.

The molecular formula of BTBAS is $C_8H_{22}N_2Si$, and the structural formula thereof is as shown in FIG. 2. In the formation of the SiN film 3 using BTBAS, the amino-silane group polymer as shown in FIG. 2 is a film forming precursor. For this reason, the SiN film 3 is formed to contain a small amount of carbon and to be uniform on the $SiO_2$ film 2, which is a base film, as shown in FIG. 3A. Therefore, it is unnecessary to perform thermal nitridation before the formation of the SiN film 3, thus enabling avoidance of variation in threshold value and decrease in mobility accompanying the thermal nitridation.

Figure 3B:
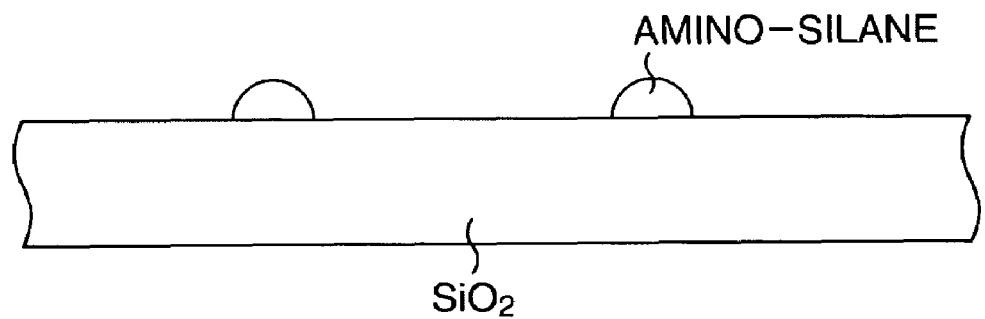

In contrast to the above, when the DCS or TCS is used as the material gas as in the prior art to form the SiN film on the $SiO_2$ film without thermal nitridation, a simple substance of amino-silane is the film forming precursor. Therefore, the SiN film is nonuniformly formed as shown in FIG. 3B. Accordingly, thermal nitridation is necessary before the formation of the SiN film.

Thus, according to the present embodiment, it is possible to form the SiN film 3 uniformly on the $SiO_2$ film without performing thermal nitridation, which diffuses nitrogen up to the surface of the semiconductor substrate 1. This will properly reduce the leak current while avoiding disadvantages (the variation in threshold value and the decrease in mobility) accompanying the diffusion of nitrogen.

It should be noted that it is preferable to perform post-annealing, for example, at 900° C. to 1100° C. after the formation of the SiN film 3. Examples of the atmosphere in this event include, for example, a $N_2$ atmosphere, a NO atmosphere, and an $O_2$ atmosphere. In the post-annealing, it is particularly preferable to perform a first annealing in the NO atmosphere or $O_2$ atmosphere and then perform a second annealing in the $N_2$ atmosphere. The annealing temperature is, for example, 1000° C.

Besides, to form a thin nitride film containing carbon, it is preferable to add $O_2$ gas, as well as BTBAS and $NH_3$, in the material gas to thereby form an oxynitride film containing carbon. This is because if no $O_2$ gas is added in the material gas, decomposition of BTBAS and $NH_3$ may sometimes be insufficient, leading to formation of a film similar to a silicon film, while addition of $O_2$ gas can accelerate the decomposition and reliably ensure insulation performance.

Figure 19:
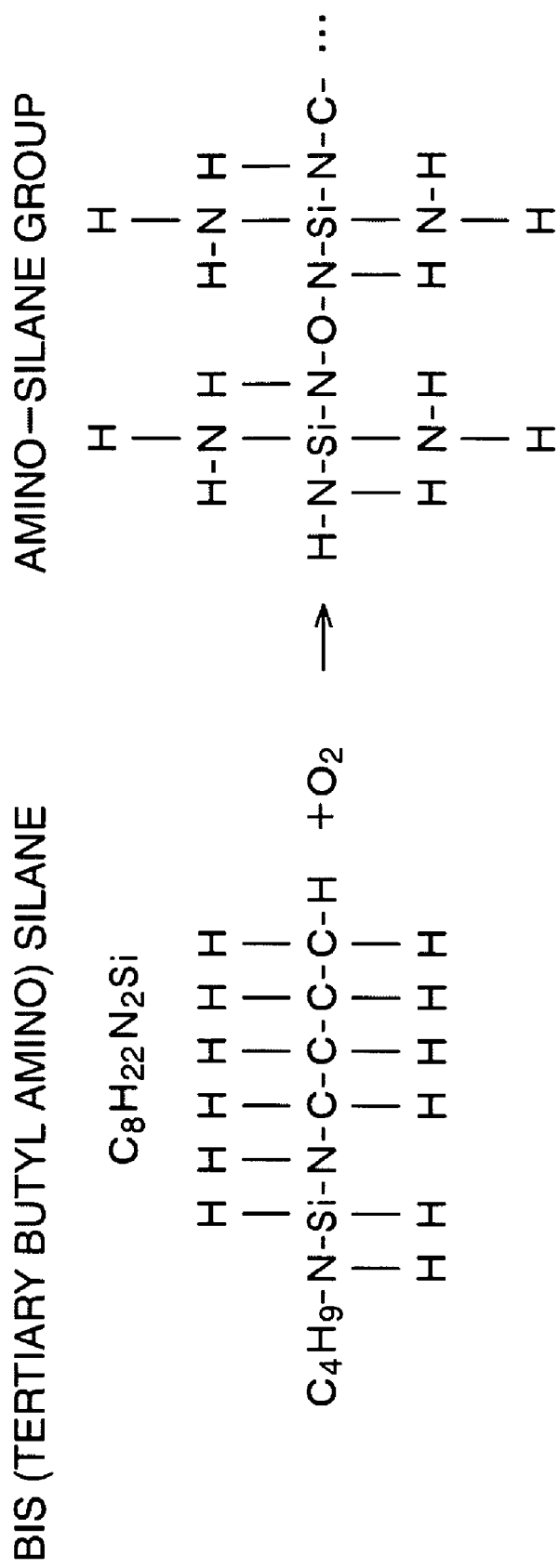
FIG. 19 is an illustration showing the change of the structural formula of BTBAS when $O_2$ gas is added.
Figure 20:
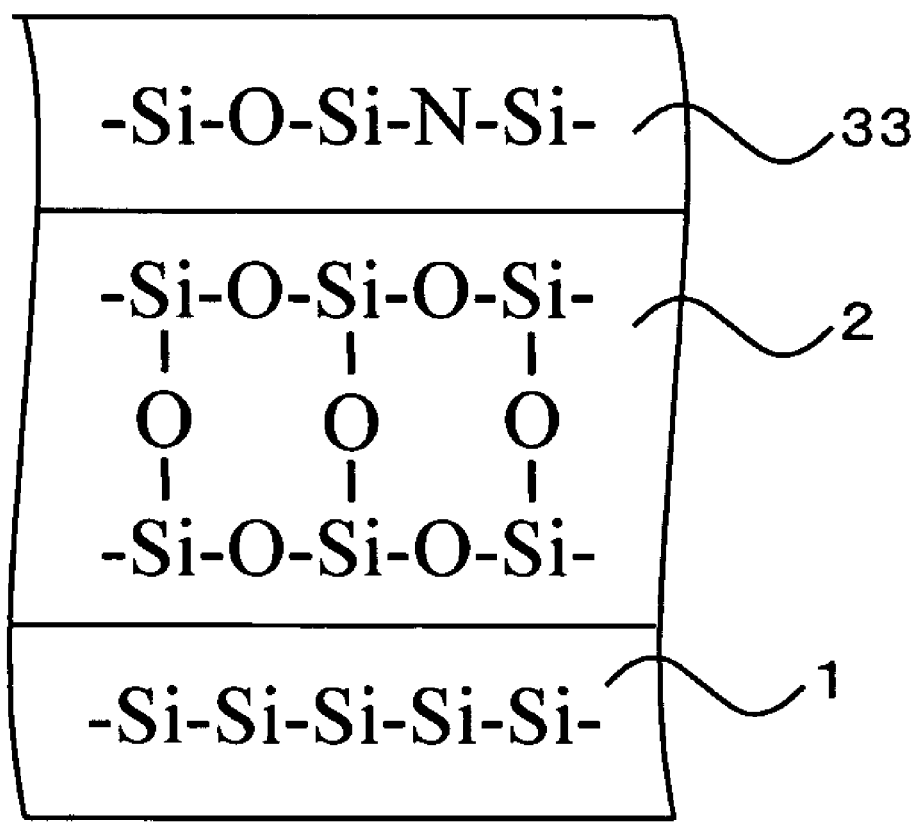
FIG. 20 is a schematic view showing a layered structure when $O_2$ gas is added.

The reaction when $O_2$ gas is added in the material gas is as shown in FIG. 19, so that an amino-silane group polymer different from that shown in FIG. 2, that is, a polymer containing oxygen is a film forming precursor. Therefore, the film to be formed will be, as shown in FIG. 20, a silicon oxynitride film (SiON film) 33 containing carbon. The SiON film containing carbon can be uniformly formed on the $SiO_2$ film 2, which is a base film, as shown in FIG. 3A. Besides, since the barrier height of the SiN film is about 2.1 eV, and the barrier height of the SiO film is 3.2 eV, the barrier height of the SiON film containing carbon is larger than the barrier height of the SiN film containing carbon. Therefore, also in this viewpoint, it can be said that the leak current can be reduced more in the SiON film containing carbon than in the SiN film containing carbon.

Figure 21:
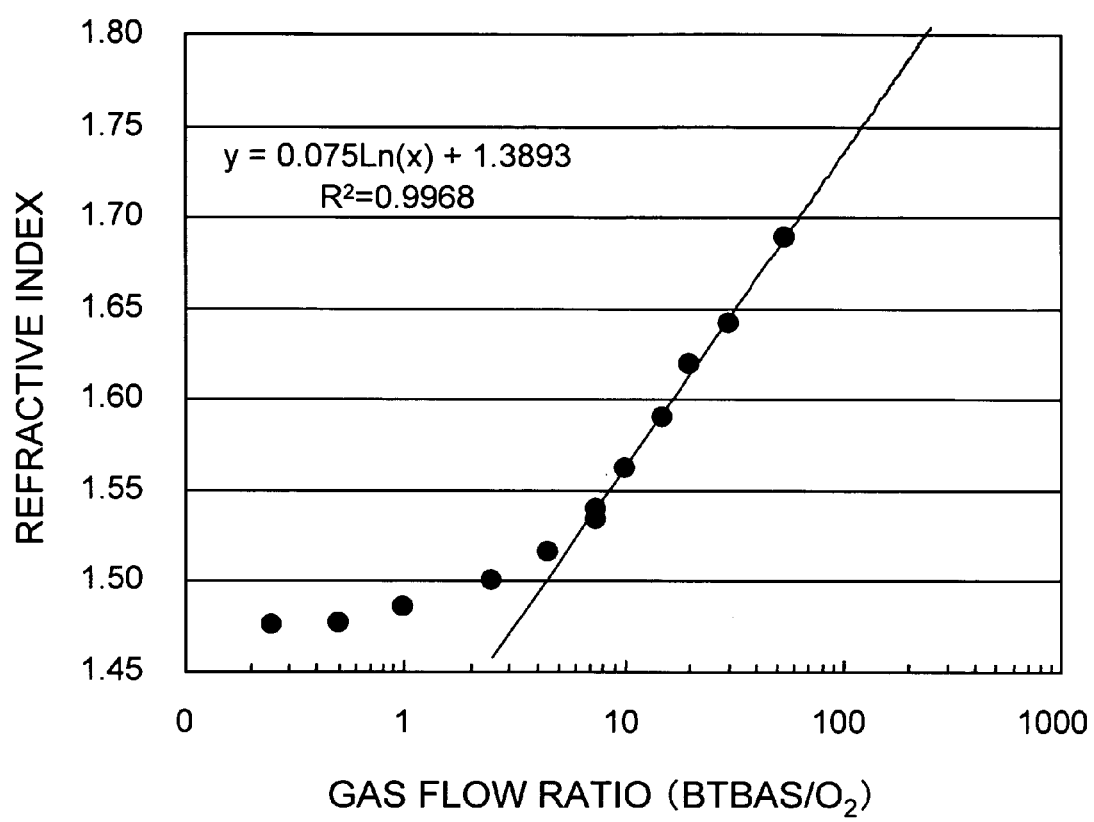
FIG. 21 is a graph showing the relation between a gas flow ratio and a refractive index of a formed film.

It should be noted that the composition of the SiON film containing carbon can be controlled, for example, by changing the flow ratio of gasses in the material gas. FIG. 21 is a graph showing the relation between the gas flow ratio and the refractive index of the formed film. As shown in FIG. 21, as the flow of BTBAS gas with respect to the flow Of $O_2$ gas increases, that is, as the relative amount of the flow of O2 gas decreases, the refractive index increases. Generally, comparing the silicon oxide film with the silicon nitride film, the refractive index is apt to be higher in the silicon nitride film. Accordingly, decreasing the relative amount of the flow of $O_2$ gas leads to formation of a SiON film similar to the silicon nitride film.

Note that when the flow ratio of $O_2$ gas in the material gas is too high, a film to be formed comes to a $SiO_2$ film, resulting in difficulty in obtaining a sufficient dielectric constant. On the other hand, when the flow ratio of $O_2$ gas in the material gas is too low, the insulation performance of the SiON film may be low. The experiment carried out by the present inventors shows that where the flow of BTBAS gas with respect to $O_2$ gas is about 6.5 to 250, even a thin SiON film ensures the insulation performance while obtaining a preferable dielectric constant. Besides, the refractive index of the SiON film formed at such a gas flow ratio will be about 1.53 to 1.80.

Figure 22:
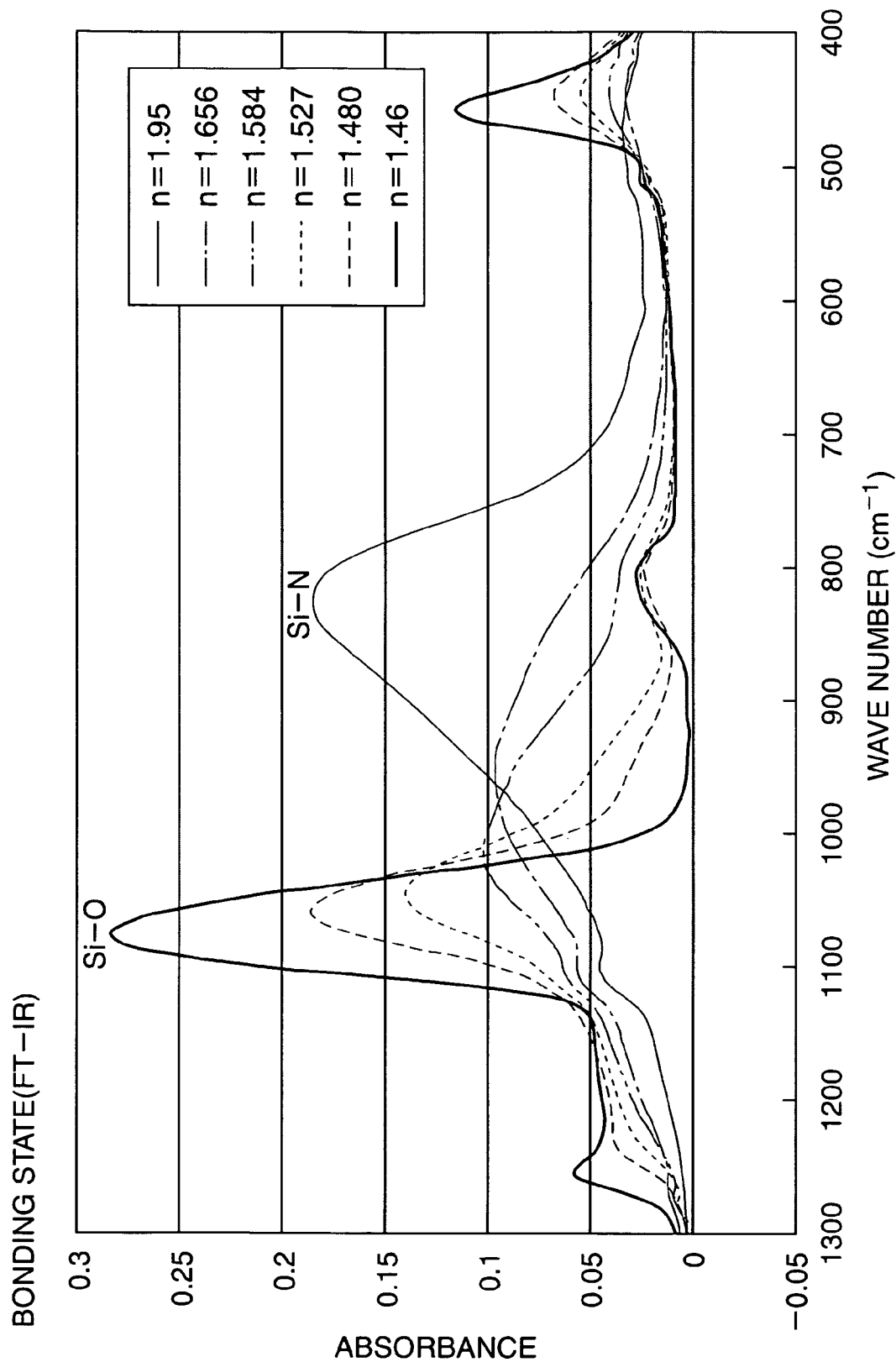
FIG. 22 is a graph showing the relation between a refractive index measured by FT-IR and a bonding state.

That the refractive index tends to be higher in the silicon nitride film is found also in FIG. 22. As shown in FIG. 22, a film having a higher refractive index n includes more Si—N bonds than Si—O bonds therein. Note that a sample with a refractive index n of 1.95 (shown by a thin line) is the SiN film containing carbon, a sample with a refractive index n of 1.46 (shown by a thick line) is a thermally oxidized film. The other samples are SiON films containing carbon formed under different formation conditions one another.

Figure 23:
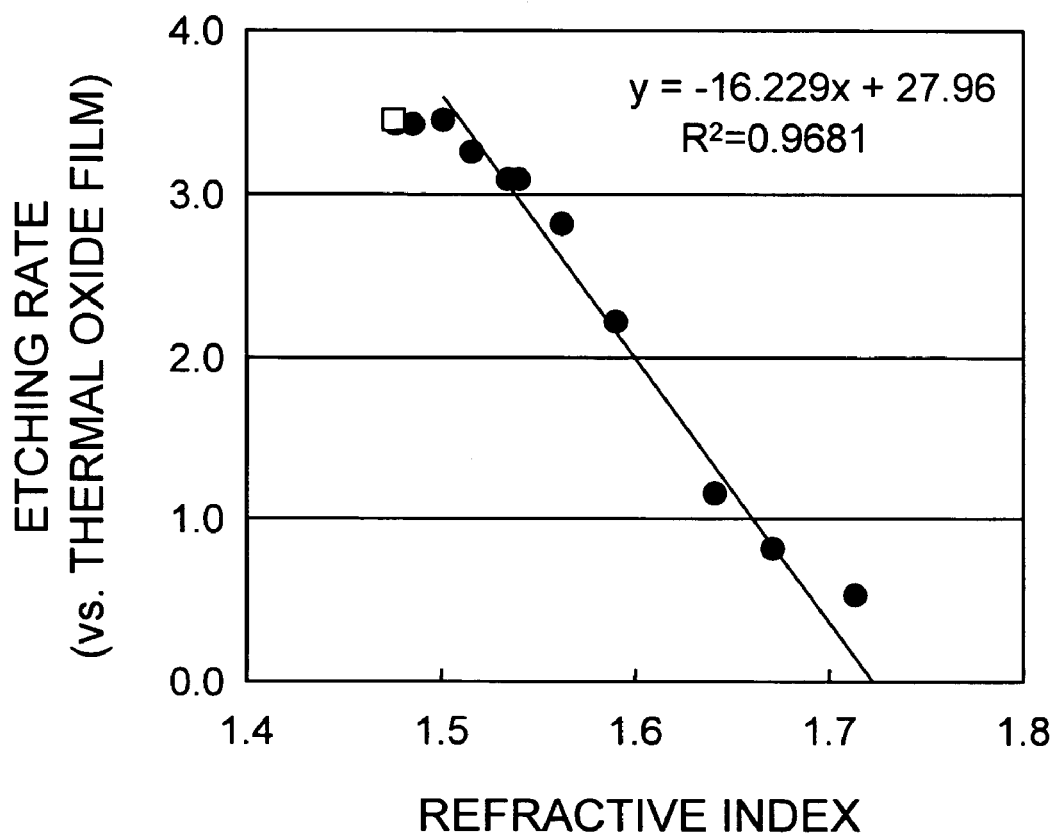
FIG. 23 is a graph showing the relation between a refractive index and an etching rate.

Further, both the SiON film and SiN film containing carbon are denser than the $SiO_2$ film. FIG. 23 is a graph showing the relation between the refractive index and an etching rate. The vertical axis of FIG. 23 represents the etching rate of each sample where the etching rate of the thermally oxidized film when using hydrofluoric acid is 1. Further, □ in FIG. 23 shows the result of the $SiO_2$ film formed by the CVD method, and ● shows the result of the SiON film formed using BTBAS gas, $N_2$ gas and $O_2$ gas. As shown in FIG. 23, the SiON film having a higher refractive index, that is, the SiON film with a lower oxygen content (see FIG. 21) due to a lower $O_2$ gas flow in the formation is lower in etching rate. In other words, the SiON film and the SiN film are harder to be etched than the $SiO_2$ film, and thus denser films.

Note that even by adding nitrogen dioxide ($N_2O$) gas or nitrogen monoxide (NO) gas in the material gas, the insulation performance can be ensured as in the case of adding the oxygen gas. Further, when nitrogen dioxide gas is added, the formation speed of the SiON film containing carbon becomes lower than that when oxygen gas is added, thus facilitating the control of the film thickness.

Figure 4:
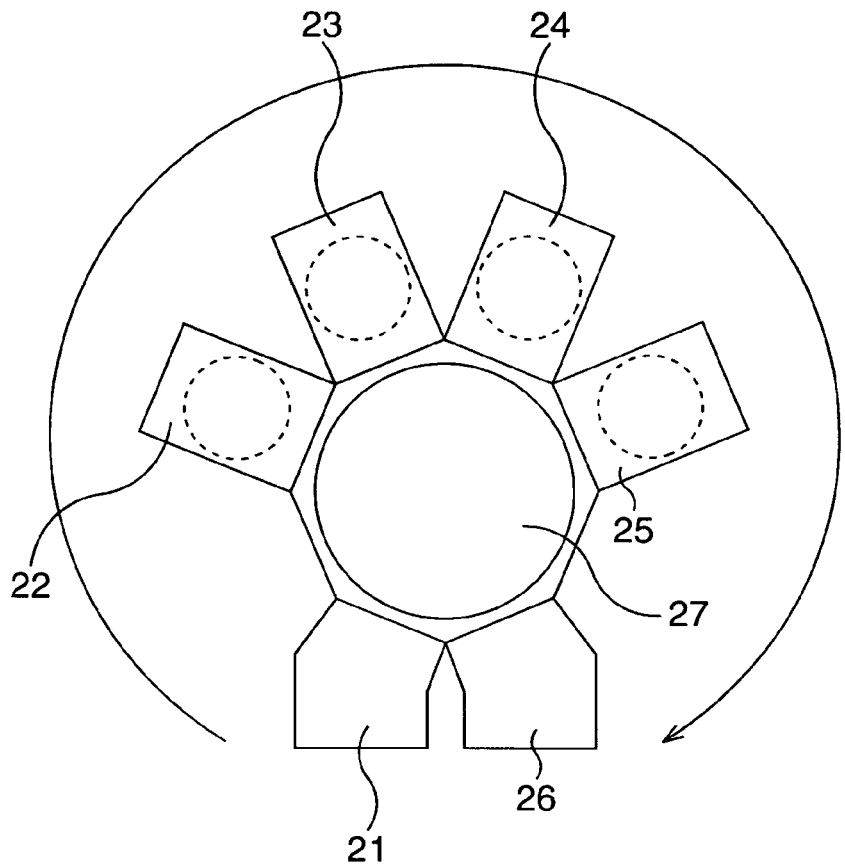
FIG. 4 is a schematic view showing an apparatus for manufacturing a semiconductor device.

Next, an apparatus for manufacturing a semiconductor device suitable for the above-described embodiment will be described. FIG. 4 is a schematic view of the apparatus for manufacturing a semiconductor device. In this manufacturing apparatus, a carry-in port 21, a base film forming section (first insulation film former) 22, a nitride film forming section (second insulation film former) 23, a post-annealing section (heater) 24, a cooling section 25, and a carry-out port 26 are connected around a carrier system (carrier) 27. The inside of the carrier system 27 is brought into a controllable atmosphere such as a $N_2$ atmosphere isolated from atmospheric air. The carry-in port 21 and the carry-out port 26 are, for example, load lock chambers.

When manufacturing a semiconductor device using the manufacturing apparatus described above, first, a semiconductor substrate is put into the carrier system 27 via the carry-in port 21. Then, in the base film forming section 22, a $SiO_2$ film is formed as a base film on the surface of the semiconductor substrate. Subsequently, the semiconductor substrate is carried using the carrier system 27 to the nitride film forming section 23 to have a SiN film formed using BTBAS in the nitride film forming section 23. Thereafter, the semiconductor substrate is carried to the post-annealing section 24 using the carrier system 27 to be subjected to post-annealing at about 1000° C. in the post-annealing section 24. Subsequently, the semiconductor substrate is carried to the cooling section 25 using the carrier system 27 to be cooled in the cooling section 25. Then, the semiconductor substrate is carried using the carrier system 27 to the carry-out port 26 to be taken out therefrom.

In the apparatus for manufacturing a semiconductor device described above, processing from the formation of the $SiO_2$ film to the post-annealing can be performed without a contact of the semiconductor substrate with atmospheric air. Therefore, unnecessary chemical reaction or the like can be suppressed which affects characteristics.

Note that the first insulation film is not limited to the $SiO_2$ film, but a SiON film may be formed when its nitrogen concentration can be controlled. Alternatively, it is also adoptable that after the formation of the first insulation film, a high dielectric constant film such as any of hafnium oxide film, zirconium oxide film, aluminum oxide film, ZrAl oxide film, lanthanum oxide film, tantalum oxide film, titanium oxide film, and yttrium oxide film is formed on the first insulation film, and a second insulation film is formed thereon to thereby form a gate insulation film in a three-layer structure.

Next, results of various experiments carried out by the present inventors will be explained.

EXAMPLE 1

Figure 5:
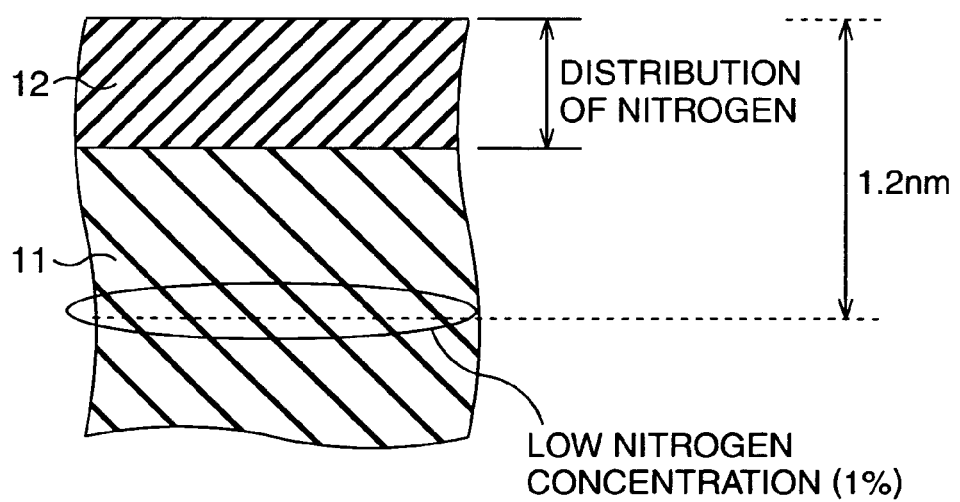
FIG. 5 is a cross-sectional view showing a method for manufacturing a semiconductor device using BTBAS.
Figure 6:
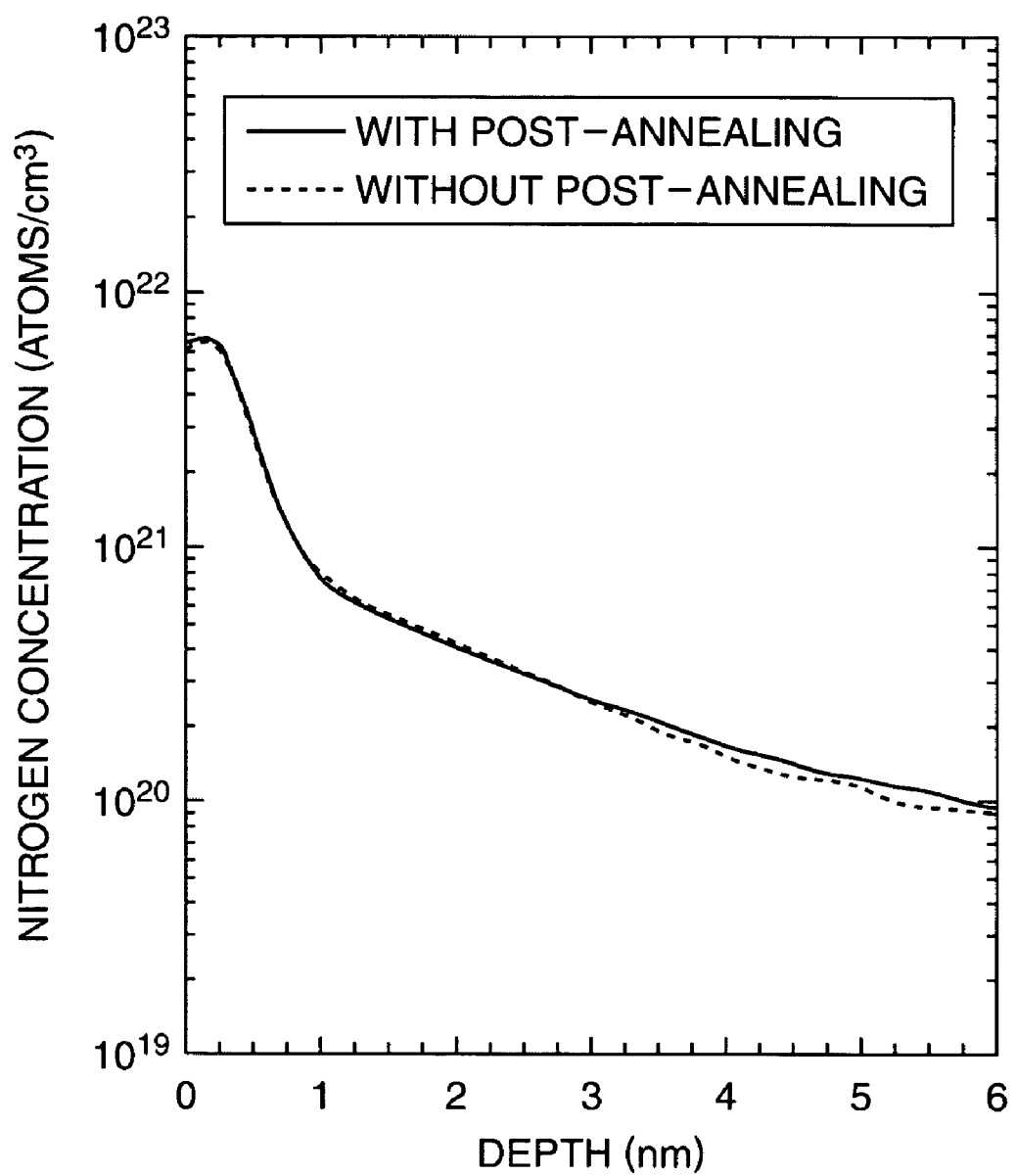
FIG. 6 is a graph showing the nitrogen profiles of samples fabricated by the method shown in FIG. 5.

In the first experiment, samples were prepared by four kinds of methods and their nitrogen profiles were measured by SIMS. Two out of the four kinds of methods are manufacturing methods according to examples of the present invention, and a SiN film 12 with a thickness of 0.2 nm was formed on a $SiO_2$ film 11 as shown in FIG. 5 by the CVD method using BTBAS and $NH_3$ as a material gas in each of these two manufacturing methods. For one of them, its nitrogen profile was measured after performance of post-annealing ($N_2$ atmosphere) at 1050° C., and for the other, its nitrogen profile was measured without performance of post-annealing. As results of the above, as shown in FIG. 6, steep distributions were obtained both in the sample (broken line) for which the post-annealing was performed and the sample (solid line) for which no post-annealing was performed. In analysis of the two samples, the nitrogen concentration was as low as about 1% at a position with a depth of 1.2 nm (physical depth) from the surface of the SiN film 12, that is, a position corresponding to the interface between the silicon substrate and the $SiO_2$ film as shown in FIG. 5.

Figure 7A:
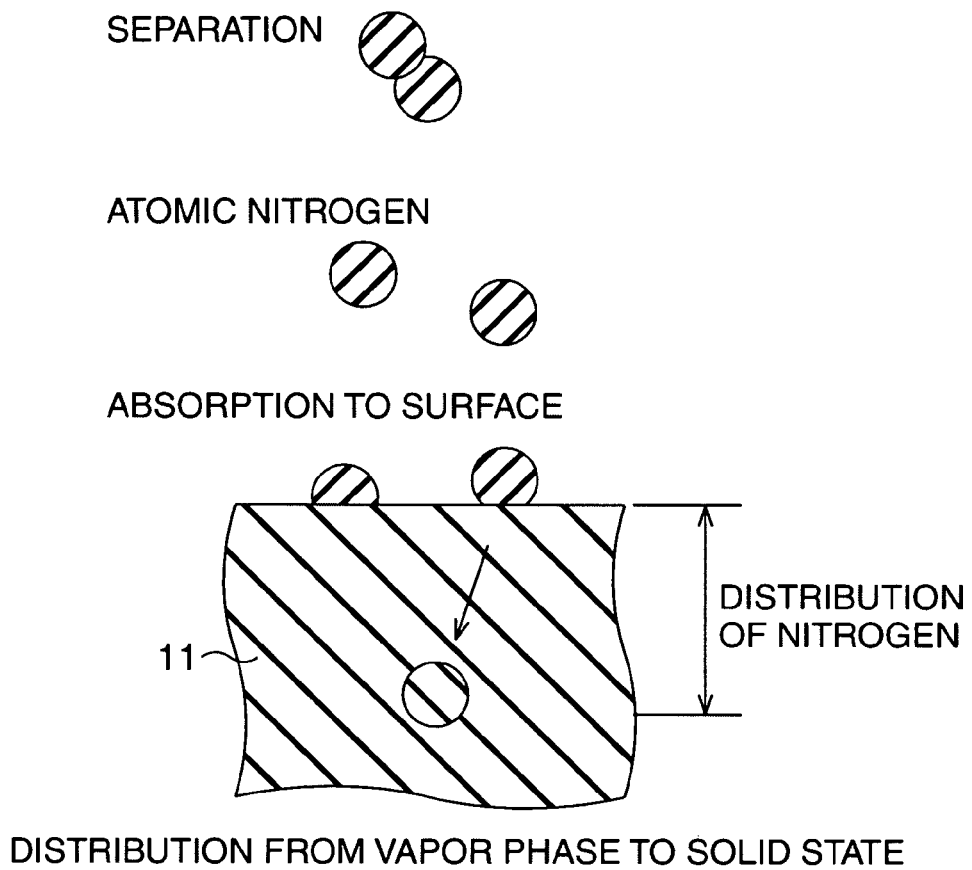
FIGS. 7A and 7B are cross-sectional views showing a method for manufacturing a semiconductor device using DCS.
Figure 7B:
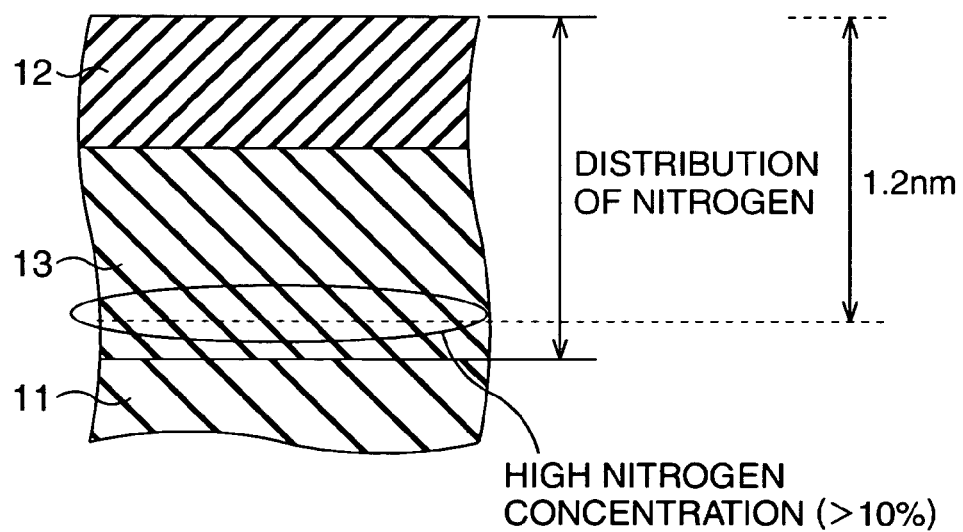
Figure 8:
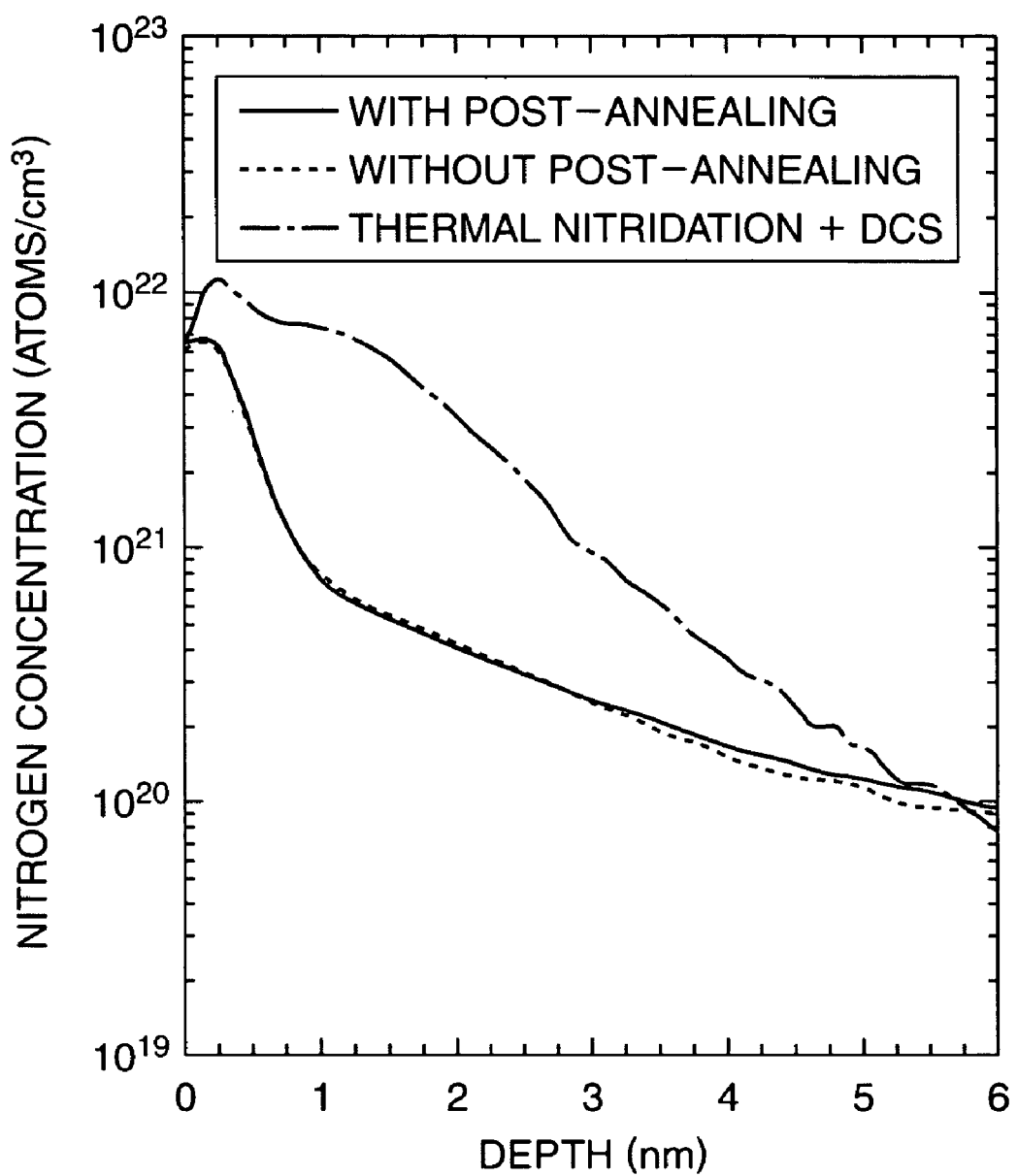
FIG. 8 is a graph showing the nitrogen profiles of a sample fabricated by the method shown in FIGS. 7A and 7B.

Further, in another kind of manufacturing method, as shown in FIGS. 7A and 7B, after the surface of the $SiO_2$ film 12 was thermally nitrided at 850° C. using $NH_3$ to form a SiON film 13, a SiN film 12 with a thickness of 0.2 nm was formed thereon by the CVD method using the DCS and $NH_3$ as a material gas. Then, when the nitrogen profile of this sample was measured, a gentle distribution (one-dotted chain line) was obtained as shown in FIG. 8. In analysis of this sample, the nitrogen concentration exceeded 10% that was extremely high at a position with a depth of 1.2 nm from the surface of the SiN film 12 as shown in FIG. 7B. This indicates that the threshold value varies with a decrease in the mobility of holes. Note that the solid line and the broken line in FIG. 8 show the same as those in FIG. 6.

Figure 9A:
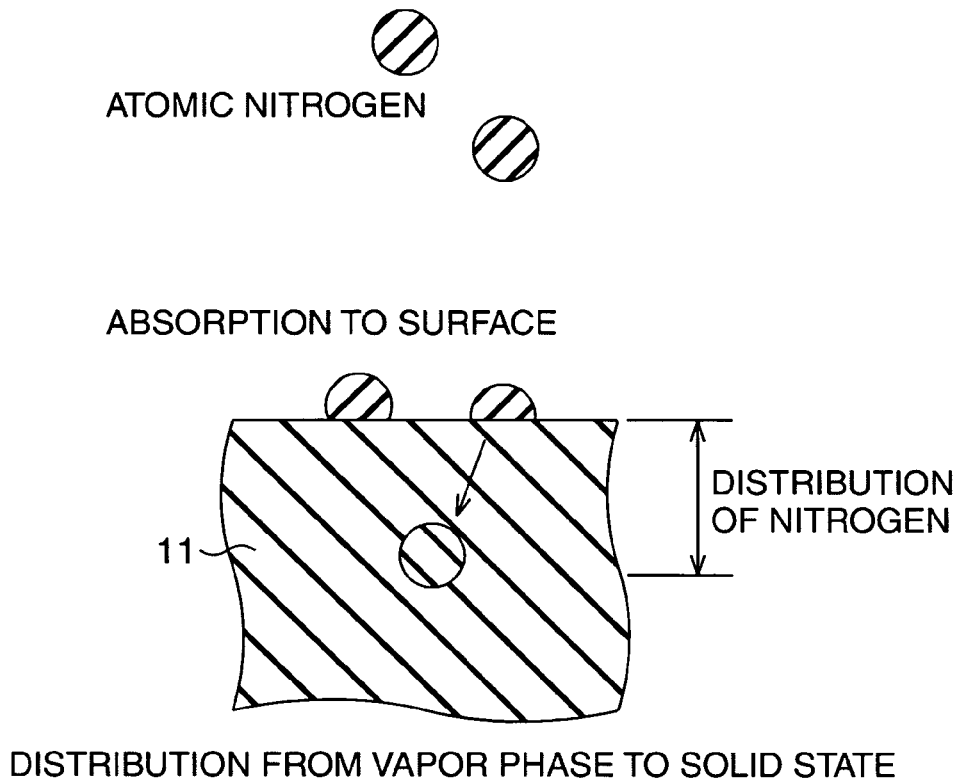
FIGS. 9A and 9B are cross-sectional views showing a method for manufacturing a semiconductor device using a remote plasma method.
Figure 9B:
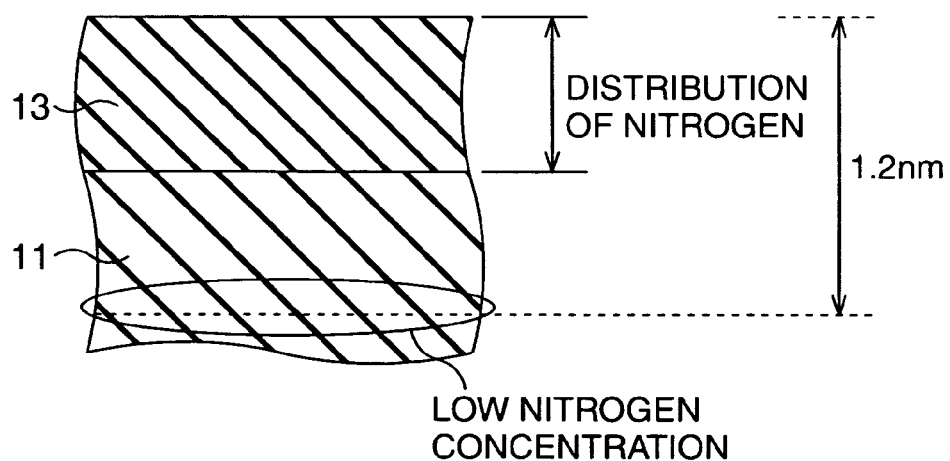
Figure 10:
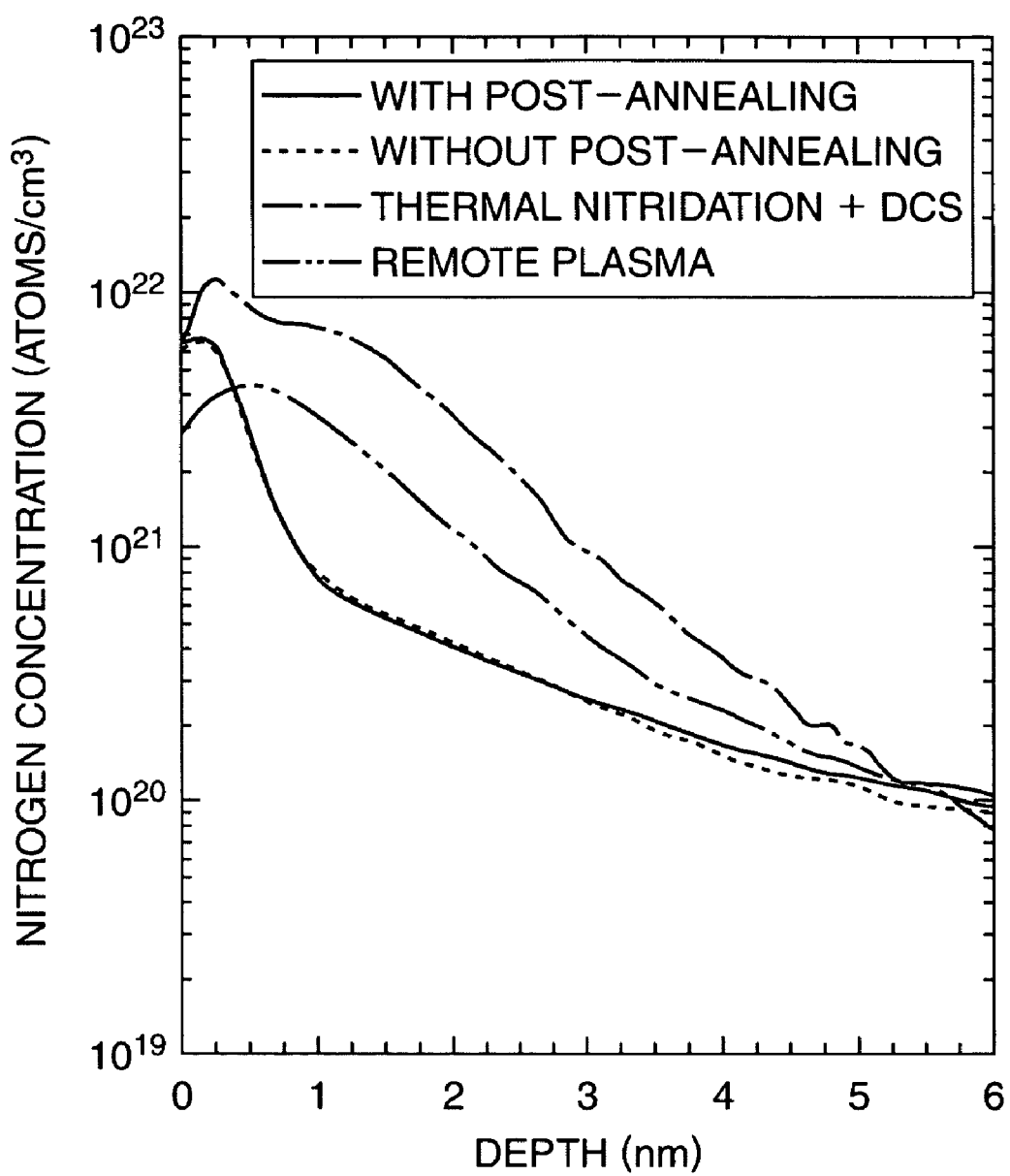
FIG. 10 is a graph showing the nitrogen profiles of a sample fabricated by the method shown in FIGS. 9A and 9B.

In the other one kind of manufacturing method, as shown in FIGS. 9A and 9B, the surface of the $SiO_2$ film 11 was nitrided by a remote plasma method to form a SiON film 13. Then, when the nitrogen profile of this sample was measured, a gentle distribution (two-dotted chain line) was obtained as shown in FIG. 10. In analysis of this sample, the nitrogen concentration was low at a position with a depth of 1.2 nm from the surface of the SiON film 13 as shown in FIG. 9B. However, also on the surface of the SiON film 13, the nitrogen concentration was low. This indicates that the leak current cannot be sufficiently reduced. Note that the solid line, the broken line, and the one-dotted chain line in FIG. 10 show the same as those in FIG. 8.

EXAMPLE 2

In the second experiment, samples were fabricated by various kinds of methods as in the first experiment, and their nitrogen profiles were measured. Fabrication conditions (manufacturing methods) of the samples are shown in Table 1. Note that "Optical film thickness of insulation film" in Table 1 shows the values of optical film thickness measured with the refractive index n fixed to 2 using an ellipsometer. The measurement region is infrared region (short wavelength).

TABLE 1

| Condition No. | Thickness of SiO₂ film | Formation condition of nitride film | Optical film thickness of insulation film |
|---|---|---|---|
| 21 | 0.85 nm | Using BTBAS | 2.05 nm |
| 22 | 0.85 nm | Using BTBAS | 1.42 nm |
| 23 | 0.85 nm | Remote plasma | 1.19 nm |
| 24 | 0.85 nm | Thermal nitridation (Using NO) | 1.11 nm |
| 25 | 0.90 nm | Using DCS | 1.51 nm |
| 26 | 0.90 nm | Using DCS | 1.34 nm |

The nitrogen profiles of these samples are shown in FIG. 11. In FIG. 11, a thin solid line shows the nitrogen profile of the sample fabricated on the condition 21 (example), a thick solid line shows the nitrogen profile of the sample fabricated on the condition 22 (example), a one-dotted chain line shows the nitrogen profile of the sample fabricated on the condition 23 (comparative example), a two-dotted chain line shows the nitrogen profile of the sample fabricated on the condition 24 (comparative example), a dot line shows the nitrogen profile of the sample fabricated on the condition 25 (comparative example), and a broken line shows the nitrogen profile of the sample fabricated on the condition 26 (comparative example).

As shown in FIG. 11, on the conditions 21 and 22 according to examples of the present invention, steep nitrogen profiles were obtained, but the nitrogen concentrations gradually changed on the conditions 23, 24, 25, and 26 according to comparative examples.

EXAMPLE 3

Figure 12A:
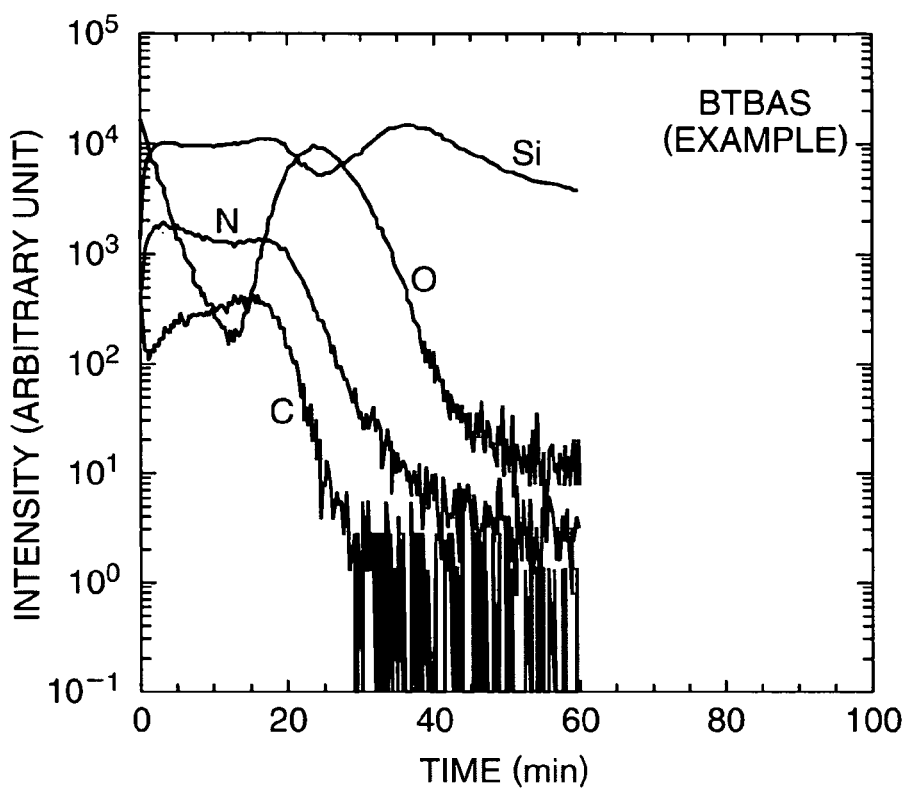
FIGS. 12A and 12B are graphs showing the carbon profiles of gate insulation films.
Figure 12B:
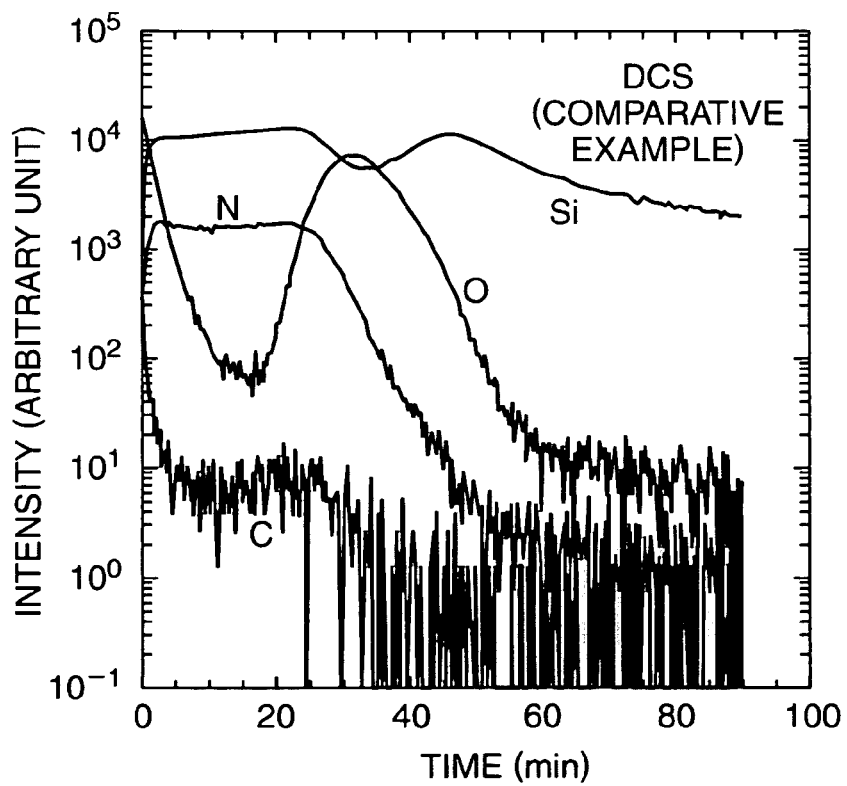

In the third experiment, samples were fabricated by two kinds of methods and their carbon profiles were measured by SIMS. One method is a manufacturing method according to an example of the present invention, and a SiN film was formed on a SiO₂ film as in the first experiment by the CVD method using the BTBAS and NH₃ as a material gas in this manufacturing method. The other method is a manufacturing method according to a comparative example, in which the surface of a SiO₂ film was thermally nitrided to form a SiON film and then a SiN film was formed thereon by the CVD method using the DCS and NH₃ as a material gas. Then, the carbon profiles of these samples were measured. As a result of this, in an example as shown in FIG. 12A, carbon was detected in the vicinity of the surface of the insulation film, that is, at a portion corresponding to the SiN film, whereas no carbon was detected over the entire insulation film in a comparative example as shown in FIG. 12B. This indicates that the SiN film formed using BTBAS contains carbon as shown in FIG. 2 and FIG. 3.

EXAMPLE 4

In the fourth experiment, the relation between the conditions of post-annealing and the mobility was examined. Specifically, six kinds of samples were fabricated as in the first experiment, and their Gm×Teff were measured. The fabrication conditions (manufacturing methods) of the samples are shown in Table 2.

TABLE 2

| Condition No. | Formation condition of nitride film | Post-annealing |
|---|---|---|
| 41 | Using BTBAS | 1st time: NO atmosphere, 2nd time: N₂ atmosphere |
| 42 | Using BTBAS | 1st time: O₂ atmosphere, 2nd time: N₂ atmosphere |
| 43 | Using BTBAS | Only one time in N₂ atmosphere |
| 44 | Using BTBAS | No |
| 45 | Remote plasma | 1st time: O₂ atmosphere, 2nd time: N₂ atmosphere |
| 46 | Using DCS | 1st time: O₂ atmosphere, 2nd time: N₂ atmosphere |

Figure 13A:
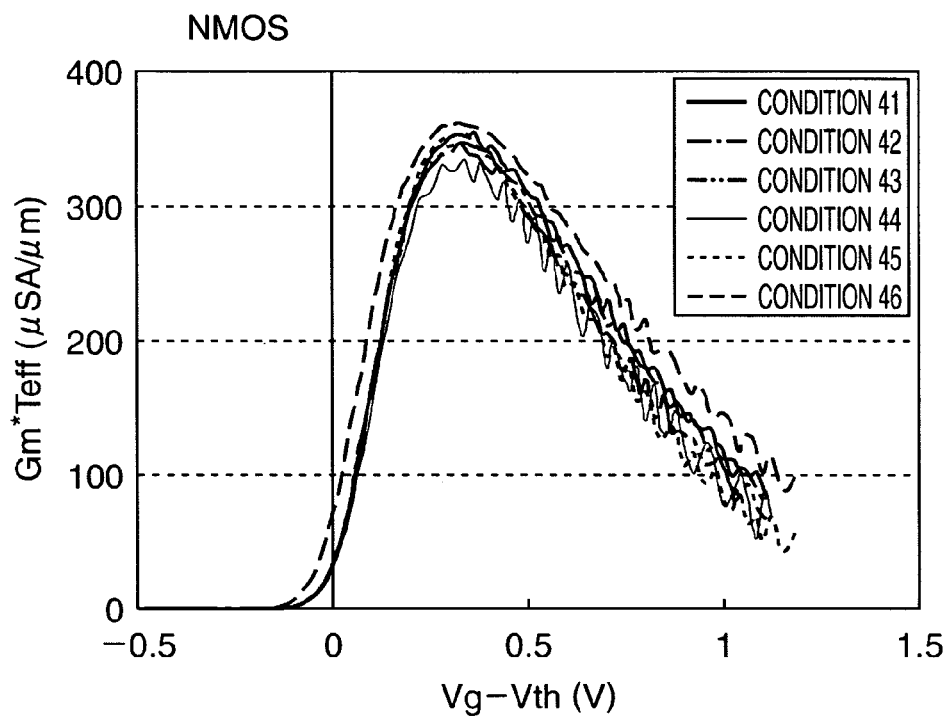
FIGS. 13A and 13B are graphs showing the mobilities of samples fabricated by various methods.
Figure 13B:
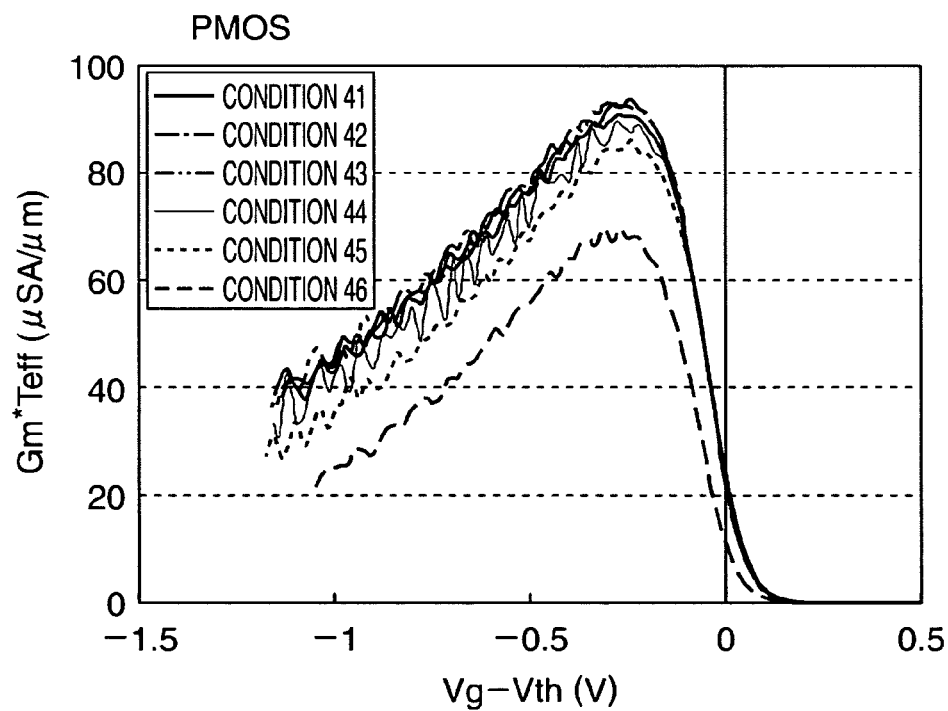

The measurement results on these samples are show in FIGS. 13A and 13B. FIG. 13A shows the mobility of electrons in an NMOS transistor, and FIG. 13B shows the mobility of holes in a PMOS transistor.

In the NMOS transistor, as shown in FIG. 13A, there was no big difference, but the mobilities of electrons on the conditions 41, 42, 43, and 44 according to examples were higher than the mobility on the condition 45 according to a comparative example.

In the PMOS transistor, as shown in FIG. 13B, the mobilities of holes on the conditions 41, 42, 43, and 44 were significantly higher than the mobility on the condition 46 according to a comparative example. Further, the mobilities on the conditions 41, 42, 43, and 44 were slightly high as compared even with the mobility on the condition 45.

In both the NMOS transistor and PMOS transistor, in comparison between the condition 44, in which post-annealing was not performed, and the conditions 41, 42, and 43, in which the post-annealing was performed, a higher mobility was obtained on the conditions 41, 42, and 43 than on the condition 44.

EXAMPLE 5

In the fifth experiment, the relation between the conditions of post-annealing and the leak current was examined. Specifically, the gate current was measured for the samples fabricated on the conditions 41, 42, 44, and 45 in the fourth experiment. The measurement results on these samples are shown in FIGS. 14A and 14B.

Figure 14A:
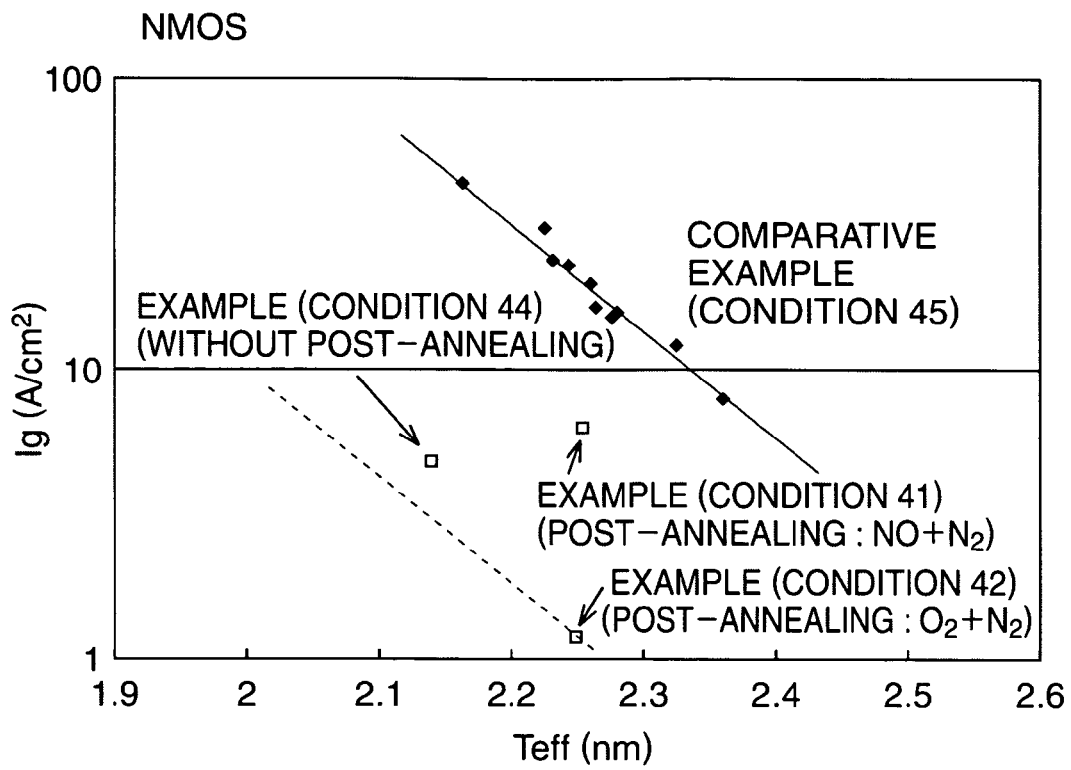
FIGS. 14A and 14B are graphs showing the leak currents of samples fabricated by various methods.
Figure 14B:
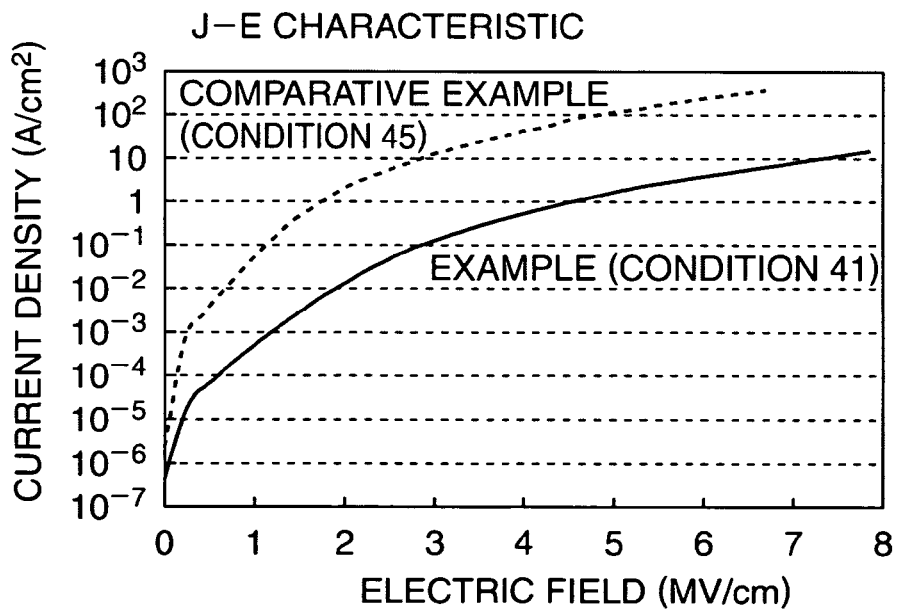

As shown in FIG. 14A, a leak current lower than that of the conventional example was obtained in each example. Further, when the relation between the electric field and the current density was measured on the conditions 41 and 45, the current density was lower on the condition 41 than on the condition 45 as shown in FIG. 14B.

EXAMPLE 6

Figure 15:
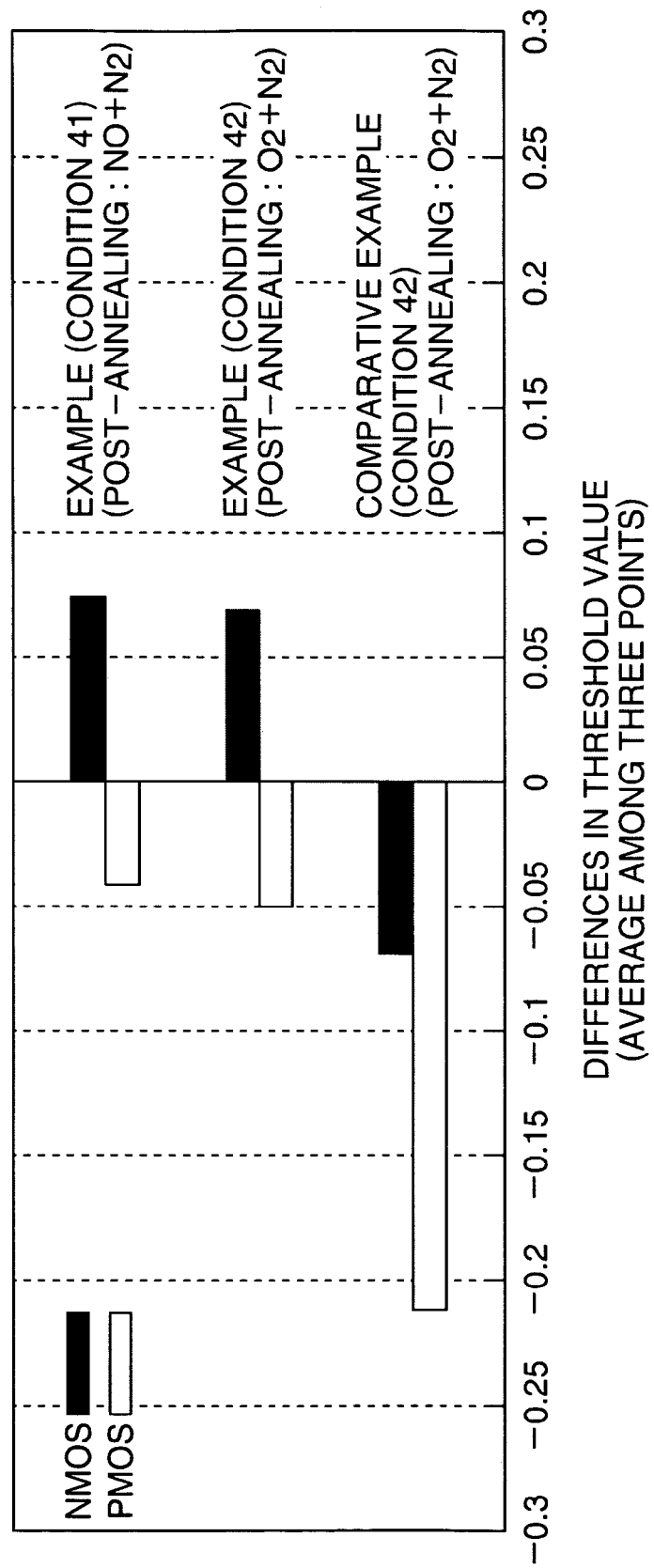
FIG. 15 is a graph showing differences in threshold value among samples fabricated by various methods.

In the sixth experiment, the relation between the conditions of post-annealing and the threshold value was examined. Specifically, the threshold value was measured for the samples fabricated on the conditions 41, 42, 45, and 46 in the fourth experiment. It should be noted that on the condition 46, the post annealing in the $O_2$ atmosphere and the post-annealing in the $N_2$ atmosphere were performed after the SiN film was formed for comparison. Besides, in each sample, the gate length was 1.04 µm, and the gate width was 20 µm. The measurement results on these samples are shown in FIG. 15. FIG. 15 shows the relative value (shift amount) of the threshold value of each sample when using as a reference voltage (0V) the threshold value of the sample fabricated on the condition 45 (remote plasma nitridation treatment, formation of a nitride film by annealing using $O_2$ and annealing using $N_2$).

As shown in FIG. 15, the threshold value shifted in the negative direction both in the NMOS transistor and the PMOS transistor on the condition 46 according to a comparative example as compared to the condition 45 using the plasma nitridation treatment. In short, the threshold value became smaller on the condition 46 than that on the condition 45. In particular, in the PMOS transistor, the magnitude of the difference (the shift amount in the negative direction) exceeded 200 mV. In contrast to this, on the conditions 41 and 42 according to examples of the present invention, the shift direction in the NMOS transistor was the positive direction (in other words, the threshold value increased), and the shift amount (magnitude of difference) in the negative direction in the PMOS transistor was suppressed to be about 50 mV. This indicates that a large mount of nitrogen diffuses to proximity to the substrate to act as positive fixed charge during thermal nitridation on the condition 46, whereas such a disadvantage does not occur on the conditions 41 and 42.

EXAMPLE 7

In the seventh experiment, the relation between the conditions of post-annealing and the nitrogen profile was examined. Specifically, samples were fabricated on four kinds of conditions as in the first experiment, and their nitrogen profiles were measured by SIMS. Fabrication conditions (manufacturing methods) of the samples are shown in Table 3. The thickness of the $SiO_2$ film was 0.85 nm. Besides, for the formation of the nitride film, BTBAS was used for all the samples.

TABLE 3

| Condition No. | Post-annealing | Optical film thickness of insulation film |
|---|---|---|
| 71 | No | 1.51 nm |
| 72 | Only one time in $N_2$ atmosphere | 1.42 nm |
| 73 | 1st time: No atmosphere, 2nd time: $N_2$ atmosphere | 1.52 nm |
| 74 | 1st time: $O_2$ atmosphere, 2nd time: $N_2$ atmosphere | 1.53 nm |

Figure 16:
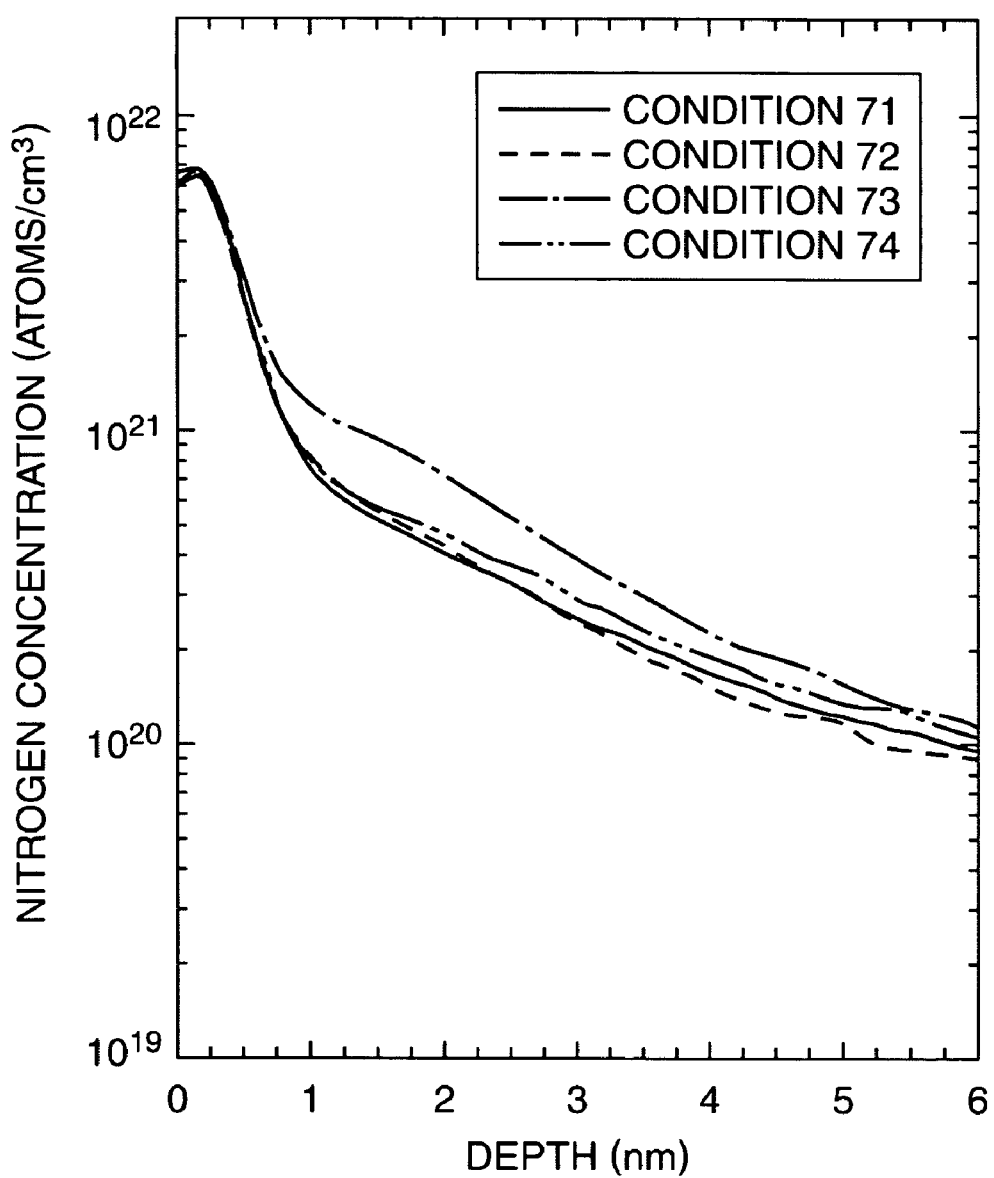
FIG. 16 is a graph showing the relation between conditions of post-annealing and nitrogen profile.

The measurement results on these samples are shown in FIG. 16. As shown in FIG. 16, the steepness of the nitrogen profile does not degrade on any of the conditions 72, 73, and 74 in which various kinds of post-annealing were performed, as compared with that on the condition 71. Therefore, it can be said that performance of post-annealing never degrades characteristics.

EXAMPLE 8

In the eighth experiment, TDDB (Time Dependant Dielectric Breakdown) life and NBTI (Negative Bias-Temperature In-stability) life were measured. TDDB life increases as the nitrogen concentration in the vicinity of the interface between the gate insulation film and the gate electrode becomes higher, and NBTI life increases as the nitrogen concentration in the vicinity of the interface between the gate insulation film and the silicon substrate becomes lower.

Figure 17:
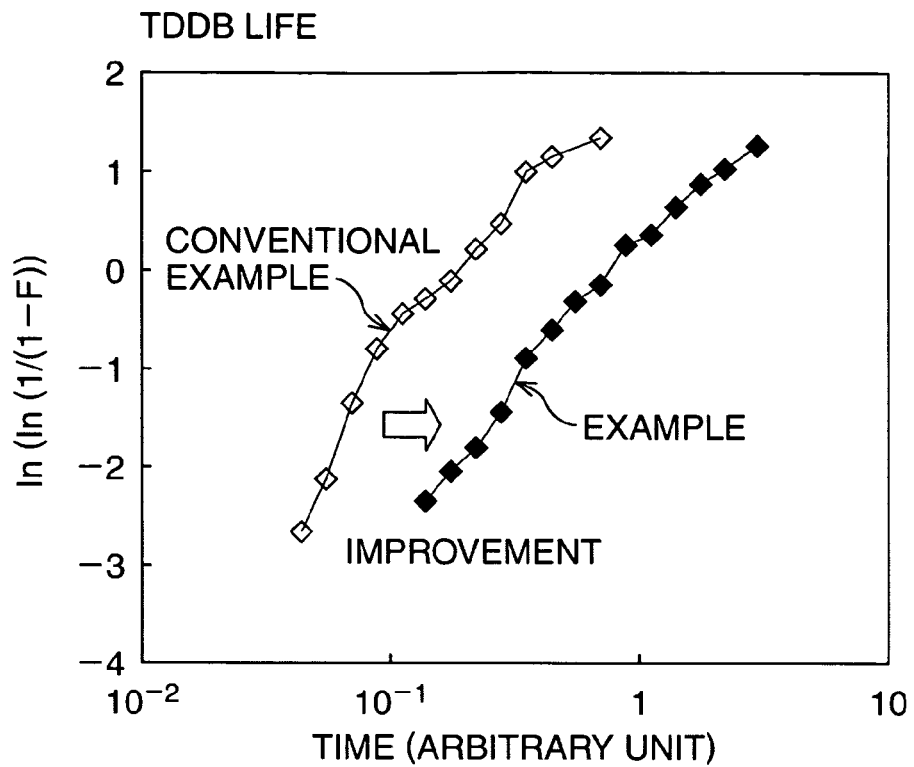
FIG. 17 is a graph showing each TDDB life of a comparative example and an example of the present invention.
Figure 18:
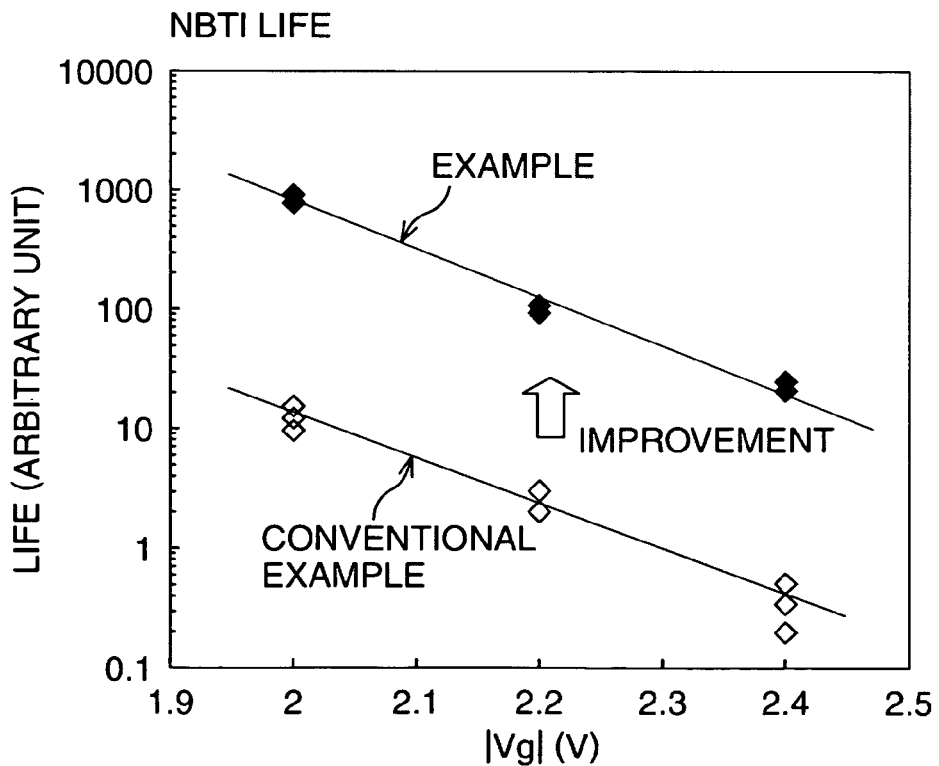
FIG. 18 is a graph showing each NBTI life of a comparative example and an example of the present invention.

FIG. 17 shows each TDDB life of a comparative example and an example of the present invention, and FIG. 18 shows each NBTI life of a comparative example and an example of the present invention. In the measurement of TDDB life, the gate length of each sample was 5 µm, and the gate width was 20 µm. Further, in the measurement of TDDB life, the failure rate F was found with the temperature set to 125° C. and the gate voltage at 2.8 V. On the other hand, in the measurement of NBTI life, the gate length of each sample was 0.16 µm, and the gate width was 20 µm. Further, the variation amount of drain current was measured with the temperature set to 150° C., so that the time when the value exceeded a predetermined value was regarded as the life of the sample. In short, NBTI life was found with saturation current as a reference.

As shown in FIG. 17, in an example of the present invention, TDDB life was improved by about one digit as compared with a comparative example. Further, as shown in FIG. 18, in an example of the present invention, NBTI life was improved by about two digits as compared with a comparative example. These results indicate that the improvement both in TDDB life and NBTI life, which has been conventionally difficult, becomes possible in an example of the present invention. In other words, the results of these experiments show that the improvement both in TDDB life and NBTI life has been difficult because conventionally the nitrogen profile in the gate insulation film has been gentle, but the use of the gate insulation film with a steep nitrogen profile as in the present invention enables the improvement both in TDDB life and NBTI life.

According to the present invention, without nitriding the surface of a first insulation film, a second insulation film composed of a nitride or an oxynitride can be formed over the first insulation film. Therefore, it is possible to reduce the leak current while suppressing an intentional increase in nitrogen concentration in the vicinity of the interface between a gate insulation film and a semiconductor substrate. This results in a steep nitrogen profile in the gate insulation film, which makes it possible to suppress the variation in threshold value and the decrease in mobility.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A method for manufacturing a semiconductor device, comprising the steps of
    forming a gate insulation film over a semiconductor substrate;
    performing post-annealing on the gate insulation film; and forming a conductive film over the gate insulation film, said step of forming the gate insulation film comprising the steps of forming a first insulation film, and forming over the first insulation film a second insulation film composed of a nitride or an oxynitride using a material gas containing carbon, wherein said step of performing the post-annealing comprises the steps of:

performing a first annealing in an atmosphere selected from at least one of the group consisting of an oxidizing atmosphere and an oxynitriding atmosphere at a first temperature; and performing a second annealing in a nitriding atmosphere at a second temperature higher than the first temperature, further comprising, between said step of forming the first insulation film and said step of forming the second insulation film, the step of forming a high dielectric constant film over the first insulation film, and the second insulation film is formed over the high dielectric constant film.

2. The method for manufacturing a semiconductor device according to claim 1, wherein one kind of film selected from a group consisting of a hafnium oxide film, a zirconium oxide film, an aluminum oxide film, a zirconium aluminum oxide film, a lanthanum oxide film, a tantalum oxide film, a titanium oxide film, and an yttrium oxide film is formed as the high dielectric constant film.

3. The method for manufacturing a semiconductor device according to claim 1, wherein a silicon nitride film or a silicon oxynitride film is formed as the second insulation film.

4. The method for manufacturing a semiconductor device according to claim 1, wherein one kind of film selected from a group consisting of a silicon oxide film and a silicon oxynitride film is formed as the first insulation film.

5. The method for manufacturing a semiconductor device according to claim 1, wherein bis (tertiary butyl amino) silane is used as the material gas containing carbon.

6. The method for manufacturing a semiconductor device according to claim 5, wherein a gas containing at least one kind selected from a group consisting of an oxygen gas, a nitrogen dioxide gas and a nitrogen monoxide gas is used as well as the material gas containing carbon.

* * * * *